United States Patent [19]
Okajima et al.

[11] Patent Number: 5,282,218
[45] Date of Patent: Jan. 25, 1994

[54] SEMICONDUCTOR LASER DEVICE

[75] Inventors: Masaki Okajima; Koichi Nitta; Genichi Hatakoshi, all of Kanagawa; Yukie Nishikawa, Chiba; Kazuhiko Itaya, Tokyo, all of Japan

[73] Assignee: Kabushiki Kaisha Toshiba, Kawasaki, Japan

[21] Appl. No.: 896,536

[22] Filed: Jun. 9, 1992

[30] Foreign Application Priority Data

Aug. 30, 1991 [JP] Japan .................. 3-220613

[51] Int. Cl.$^5$ ............................... H01S 3/19
[52] U.S. Cl. ......................... 372/46; 372/45
[58] Field of Search .................. 372/45, 46

[56] References Cited

U.S. PATENT DOCUMENTS

| 4,918,496 | 4/1990 | Matsushima et al. | 257/13 |
| 5,016,252 | 5/1991 | Hamada et al. | 372/45 |
| 5,036,521 | 7/1991 | Hatakoshi et al. | 372/46 |

FOREIGN PATENT DOCUMENTS 0426419  5/1991  European Pat. Off. .
3-21093  1/1991  Japan .

OTHER PUBLICATIONS

J. Appl. Phys. vol. 54, pp. 2052–2056; H. Asai, et al.; Apr. 1983. "Energy Band–Gap Shift With Elastic Strain In Ga$_x$In$_{1-x}$P Epitaxial Layers On (001) GaAs Substrates".
J. Appl. Phys. vol. 68, pp. 3822–3825; N. K. Dutta, et al.: Oct. 15, 1990. "Performance Characteristics of In$_{0.2}$Ga$_{0.8}$As/GaAs Multiquantum–Well Lasers".
Electronic Letters, pp. 1278–1280; M. C. Tatham, et al.; Jul. 1991. vol. 27 No. 14: "Frequency Response and Differential Gain in Strained and Unstrained InGaAs-/InGaAsP Quantum Well Lasers".
Japanese Journal of Applied Physics, Extended Abstracts 22th Conference of Solid State Devices and Materials 1990, pp. 565–568, K. Itaya, et al., "High--Temperature CW Operation of 630nm Band InGaAlP Visible Light Laser Diodes".
Applied Physics Letters, vol. 58, No. 9, Mar. 4, 1991, pp. 879–880, J. Hashimoto, et al., "Effects of Strained–Layer Structures on the Threshold Current Density of AlGaInP/GaInP Visible Layers".
Applied Physics Letters, vol. 59, No. 2, Jul. 8, 1991, pp. 149–151, K. Nitta et al., "High–Temperature Operation of High–Power InGaAlP Visible Light Laser Diodes with an In $(0.5+\gamma)$Ga$(0.5+\gamma)$P Active Layer".
Tech. Digest Cleo'91, pp. 94–95; C. J. Chang-Hasnain, et al.; May, 1991. "High Performance 634-nm InGaP-/InGaAlP Strained Quantum-Well Lasers".
Tech. Digest Cleo'91, pp. 96–97; T. Katsuyama, et al.; May 1991. "Strain Effects on the Performance of AlGaInP/Ga In P Single Quantum Well Visible Laser Diodes".

Primary Examiner—Georgia Y. Epps
Attorney, Agent, or Firm—Oblon, Spivak, McClelland, Maier & Neustadt

[57] ABSTRACT

A semiconductor laser device for radiating a laser beam from a double heterostructure section in which injected carriers having an energy source of the laser beam are confined consists of a compound semiconductor substrate with a prescribed lattice constant for loading the double heterostructure section, a lattice mismatched active layer with a first lattice constant which is 0.5% to 2.0% larger than the lattice constant of the substrate in the double heterostructure section for radiating the laser beam, a lattice mismatched cladding layer with a second lattice constant which is 0.2% to 2.0% smaller than the lattice constant of the substrate for confining the injected carriers in the active layer, and a cladding layer for confining the injected carriers in the active layer by co-operating with the lattice mismatched cladding layer.

20 Claims, 22 Drawing Sheets

FIG. 4

ACTIVE LAYER ($In_{1-Y}Ga_YP$)

| LATTICE MISMATCH $\Delta a/a \times 100$ (%) | 1 – Y | Y | $Eg_{(eV)}$ |
|---|---|---|---|
| 0 ‰ | 0.50 | 0.50 | 1.85 |
| 0.5 ‰ | 0.56 | 0.44 | 1.83 |
| 1 ‰ | 0.62 | 0.38 | 1.81 |
| 2 ‰ | 0.74 | 0.26 | 1.77 |
| 2.5 ‰ | 0.80 | 0.20 | 1.75 |

CLADDING LAYER ($In_{1-Y}(Ga_{0.3}Al_{0.7})_YP$)

| LATTICE MISMATCH $\Delta a/a \times 100$ (%) | 1 – Y | Y | $Eg_{(eV)}$ |
|---|---|---|---|
| 0 ‰ | 0.50 | 0.50 | 2.30 |
| –0.5 ‰ | 0.45 | 0.55 | 2.33 |
| –1.0 ‰ | 0.40 | 0.60 | 2.36 |
| –2.0 ‰ | 0.30 | 0.70 | 2.42 |

FIG.19
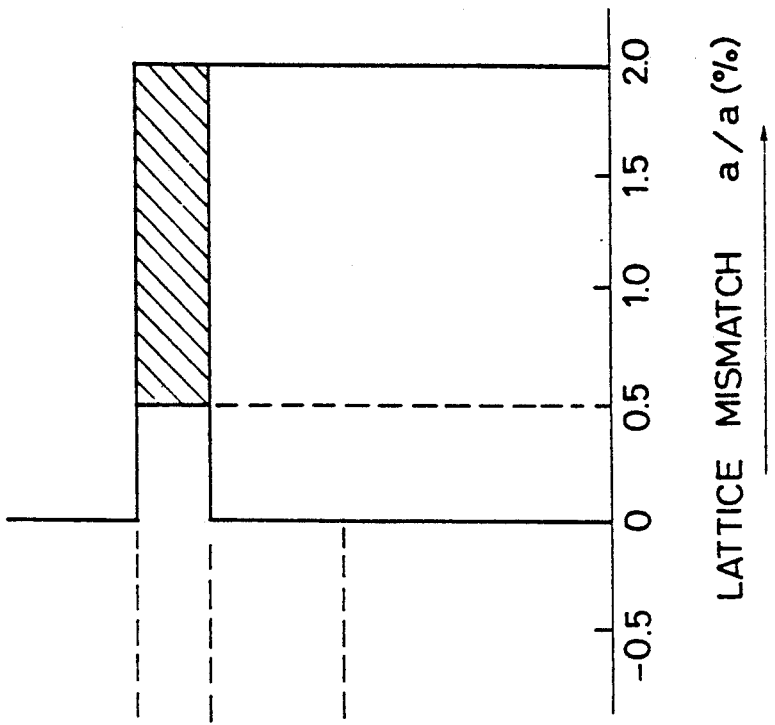
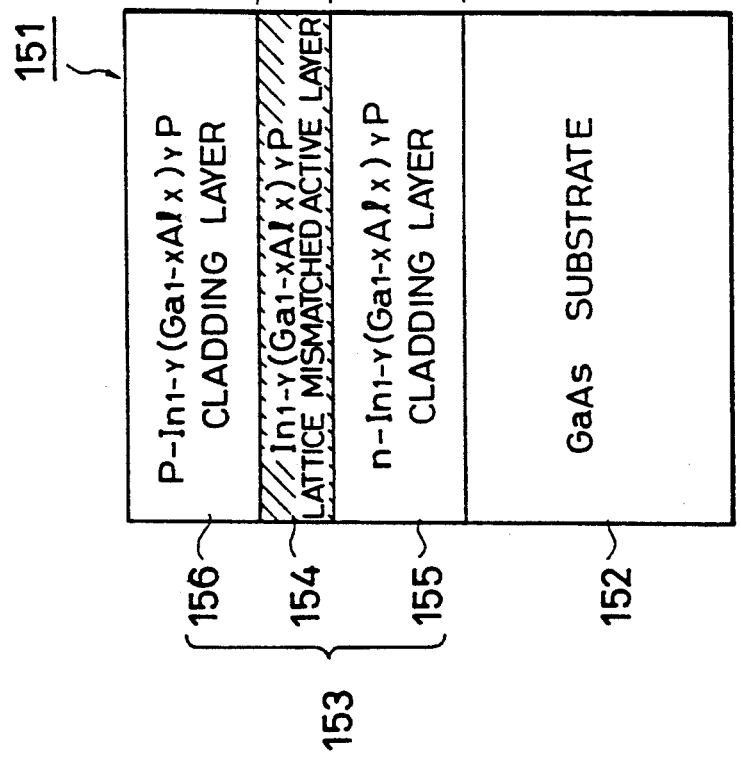

F I G. 21
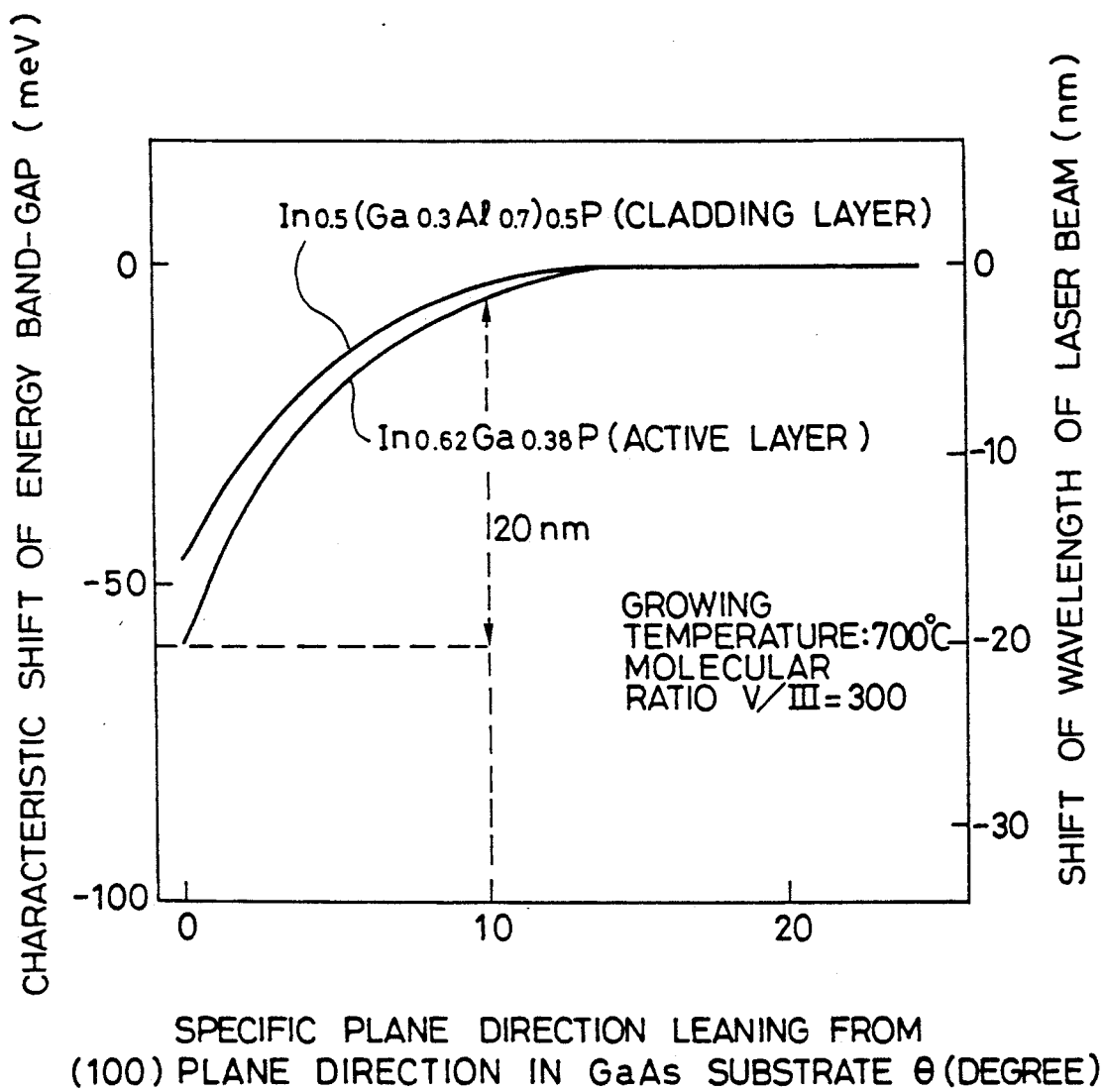

SEMICONDUCTOR LASER DEVICE

BACKGROUND OF THE INVENTION

1. Field of the Invention

The present invention relates to a semiconductor laser device formed by a compound semiconductor material, and, in particular to a semiconductor laser device in which an active layer is formed by an InGaAlP type of material.

2. Description of Background

Recently, an InGaAlP type of material has been notable as the material of a luminescent semiconductor device in which laser beams with the wavelength in a range from 0.5 to 0.6 μm are radiated because the material has the maximum energy band gap among mixed crystals of a III-V families type of compound semiconductor other than nitriding materials.

In particular, a double-heterostructure type of semiconductor laser device in which a substrate is formed by a GaAs type of material and an active layer and cladding layers are formed by an InGaAlP type of material on condition that lattice constants of the layers are matched with that of the substrate can be applied for many practical purposes. The reason is because a visible laser beam with 0.6 μm wavelength is continuously radiated from the active layer at a room temperature in the double-heterostructure type of semiconductor laser device.

The laser beam radiated from the above semiconductor laser device can be focused on a small beam spot because the wavelength of the radiated laser beam is comparably short. Therefore, information can be stored in an optical disk in a high density by utilizing the laser beam radiated from the double-heterostructure type of semiconductor laser device. However, it is required to be stably operated at over 30 mW of the light intensity for practical use in the double-heterostructure type of semiconductor laser device.

That is, there are many causes by which the intensity of the laser beam is restrained in the semiconductor laser device. As a main cause, a kink phenomenon has been well known because the phenomenon influences the characteristics between the electric current applied to the device and the intensity of the laser beam radiated from the device. That is, the linearity of the characteristics deteriorates by the kink phenomenon.

Therefore, when the kink phenomenon is generated because the intensity of the laser beam is increased over a kink level, a lateral mode of the laser beam indicating a light intensity distribution in the active layer is deformed so that the characteristics of the laser beam deteriorate. As a result, the semiconductor laser is difficult to utilize as a light source for an optical disk and the like.

Accordingly, the semiconductor laser device is required to keep the linearity in the characteristics between the electric current and the intensity of the laser beam. In other words, the semiconductor laser device with a high kink level is required to obtain a high intensity of the laser beam.

As one of mechanisms to generate the kink phenomenon, a hole-burning effect has been well known. In detail, the induced emission of the laser beam resulting from the recombination of an electron and a positive hole is strongly generated in high intensity light regions in the active layer so that the concentration of carriers such as the electrons and the positive holes are decreased in the high intensity light regions. Therefore, the density distribution of the carriers is deformed in the active layer so that a gain distribution relating to the ratio of the intensity of the induced emission to the electric current applied to the device is deformed. That is, the lateral mode of the laser beam is deformed.

In general, the density distribution of the carriers becomes difficult to deform as a diffusion length of the carrier is increased. In case of the InGaAlP type of materials, the diffusion length of the positive hole is very short so that the kink level is decreased.

As the other main cause by which the intensity of the laser beam is restrained in the semiconductor laser device, so-called Catastrophic Optical Damage (COD) has been well known. In detail, the laser beam radiated in the active layer is absorbed by the active layer so that a pair of the electron and the positive hole is generated in the active layer. Thereafter, recombination heat is generated in the active layer when the pair of the electron and the positive hole is subjected to a non-radiative recombination so that the active layer is heated. Therefore, the energy band-gap is decreased so that the absorption of the laser beam radiated in the active layer is accelerated. As a result, the crystal of the active layer is melted in the high light intensity region so that the semiconductor laser device is destroyed.

The generation of the COD depends on the light intensity in the active layer. Therefore, in cases where a large amount of light is confined in the active layer because the device has a low gain characteristic or the width of the lateral mode of the laser beam is short, the light intensity achieves a COD level at which the COD is generated in the high light intensity region although the laser beam is radiated at the comparatively low light intensity in other regions. Accordingly, the semiconductor laser device with a high COD level is required to obtain a high intensity of laser beams.

Generally, the light intensity in the active layer is reduced by utilizing a thin active layer to raise the COD level. However, in cases where the active layer is thinned in the semiconductor laser device formed by the InGaAlP type of materials, materials with a comparatively large energy band-gap are difficult to utilize as cladding layers which are arranged to sandwich the active layer and are utilized to confine injected carriers into the active layer. The reason is as follows.

In general, as is well known, the energy band-gaps in the cladding layers are respectively larger than that in the active layer. Therefore, carriers injected in the semiconductor laser device are confined in the active layer because the injected carriers cannot move into the cladding layers by the energy barrier indicating the difference in the energy band-gap between the active layer and the cladding layer.

In cases where the active layer is thinned, a threshold value of the electric current applied to the device is increased according to a quantum theory so that the injected carriers have a high energy. Thereafter, the high energy carriers recombine to radiate the laser beam. In this case, the energy band-gap in the active layer is substantially increased because high energy electrons over a conduction band recombine with high energy positive holes under a valence band. As a result, the energy barrier between the active layer and the cladding layer is decreased so that the injected carriers leak to the cladding layers. In other words, the injected carriers cannot be efficiently confined in the active layer.

More, the energy difference between the conduction band of the active layer and the conduction band of the cladding layer in the InGaAlP type of materials is smaller than that in conventionally utilized GaAlAs type of materials. Therefore, it is difficult to prevent the injected electrons from leaking to a p type cladding layer. That is, the electrons are difficult to efficiently confine in the InGaAlP type of materials. Specifically, when the operating temperature is raised, the light intensity is prominently decreased because the electrons have a large energy. Therefore, the operation is difficult when the light intensity in the active layer is high.

In general, the lattice constant of the InGaAlP type of material can be shifted depending on the composition of a mixed crystal in the material. Therefore, in cases where the InGaAlP type of materials are utilized for the semiconductor laser device, it is conventionally required to reduce the difference between the lattice constant of the substrate and the lattice constant of the active layer arranged on the substrate between a room temperature and a growing temperature of the mixed crystal. The reason is as follows.

The increase of the difference between the lattice constants results in the generation of misfit dislocations or the growth of undesirable lattice defects resulting from the generation of stress, so that characteristics of the material easily deteriorate. Specifically, the deterioration of the material characteristics is remarkable in the semiconductor laser device in which the density of the injected carriers and the light intensity in the active layer is high.

A symbol $\Delta a/a$ relating to the difference between the lattice constant of the substrate and the lattice constant of the active layer is defined as a lattice mismatch as follows, $$\Delta a/a = (b_1 - b_0)/b_0$$

where the symbol $b_1$ represents the lattice constant of the active layer and the symbol $b_0$ represents the lattice constant of the substrate. The lattice mismatch $\Delta a/a$ is required to be within about 0.2% in the conventional semiconductor laser device.

The influence of the kink phenomenon and the COD are further described in detail in the conventional semiconductor laser device.

FIG. 1 is a schematic cross sectional view of a ridge waveguide type of InGaAlP semiconductor laser device with a conventional structure for controlling the lateral mode of the laser beam radiated from the device.

As shown in FIG. 1, a ridge waveguide type of InGaAlP semiconductor laser device 301 comprises:

n type GaAs substrate 302, n type GaAs buffer layer 303, n type InGaAlP cladding layer 304, in InGaP active layer 305, p type InGaAlP cladding layer 306 with ridge shaped section 306A, p type InGaP cap layer 307, and p type GaAs contact layer 308.

The lattice constants of the layers 303 to 308 approximately agree with that of the substrate 302 because the composition of each layer is adjusted. In other words, the lattice constants of the layers 303 to 308 match with that of the substrate 302.

In the above structure of the ridge waveguide type of InGaAlP semiconductor laser device 301, radiative lights are confined in a ridge waveguide region 309 by the ridge shaped section 306A of the cladding layer 306, the cap layer 307 fabricated over the ridge waveguide region 309, the contact layer 308 functioning to absorb the radiative light. Therefore, the laser beam radiated from the device 301 is controlled in the lateral mode thereof. For example, the operation of the above device 301 is described in detail in a literature "Applied Physics Letters, Vol. 56, No. 18, 1990, page 1718-1719".

In cases where both the composition of the mixed crystal forming the active layer 305 and the composition of the mixed crystal forming the cladding layers 304, 306 are set to satisfy the lattice mismatch $\Delta a/a$ within about 0.2%, the kink level is about 40 mW. That is, the lattice mismatch $\Delta a/a$ determines the maximum intensity of the laser beam designated by the upper limit of the kink level.

FIG. 2 is a graphic view showing the temperature dependence of characteristics between the electric current (mA) applied to the device and the intensity (mW) of the laser beam in the semiconductor laser device shown in FIG. 1.

As shown in FIG. 2, the operation in the semiconductor laser device can be implemented up to the laser intensity 20 mW because the active layer 305 is thinned, for example, to 0.04 μm (400 Å) thick. Moreover, The COD level is a high value such as 51 mW (not shown).

However, the light intensity is remarkably decreased at high temperatures above 40° C. so that the laser intensity is about 10 mW in practice at an operating temperature of about 50° C. Accordingly, the COD level at the operating temperature limits the practical light intensity.

On the other hand, a laser beam with a short wavelength is superior to store information in an optical disk in a high density. The reason is as follows. In cases where the laser beam is focused to make a minute spot by utilizing an optical system, the theoretical limitation of the diameter of the minute spot is proportional to the wavelength of the laser beam.

Recently, a literature "Electronics letters 3rd, Aug. 1989, Vol. 25, No. 14, pages 905-907" has been reported. As described in the literature, an InGaAlP type of mixed crystal is fabricated on a substrate by utilizing an epitaxial growth technique. A crystal forming the substrate has a specific plane direction which leans toward a suitable direction equivalent to a <011> direction from a (100) plane. In this case, a natural superlattice structure regularly directed in a <111> direction is difficult to fabricate in the mixed crystal on the substrate. Moreover, the energy band-gap in the mixed crystal with no natural superlattice structure is larger than that in the mixed crystal with the natural superlattice structure.

Therefore, the wavelength of the laser beam can be shortened by utilizing the mixed crystal with no natural superlattice structure although the composition of the mixed crystal is not changed. However, there is a drawback that the deterioration of the temperature characteristics shown in FIG. 2 is not still solved.

Moreover, as shown in FIG. 1, in cases where the mixed crystal with no natural superlattice structure is utilized in the conventional ridge waveguide type of InGaAlP semiconductor laser device 301, the ridge shaped section 306A of the p type cladding layer 306 becomes asymmetric because the section 306A have a (111) plane direction and the substrate 302 is leaned from the (100) plane.

Therefore, the lateral mode of the laser beam radiated from the laser device with the asymmetric ridge shaped section is unstable as compared with that of the laser beam radiated from the laser device with the symmetric section 306A. As a result, the kink phenomenon can be easily generated although the laser intensity is low.

SUMMARY OF THE INVENTION

A first object of the present invention is to provide, with due consideration to the drawbacks of such conventional device, a semiconductor laser device in which the laser beam emitting operation is implemented in a high temperature and the maximum laser intensity is improved in a high temperature for practical use.

A second object is to provide a semiconductor laser device in which the maximum laser intensity is improved in a high temperature for practical use and a laser beam with a short wavelength is radiated.

The first object is achieved by the provision of a semiconductor laser device for radiating a laser beam from a double heterostructure section in which injected carriers having an energy source of the laser beam are confined, comprising:

a compound semiconductor substrate with a prescribed lattice constant for loading the double heterostructure section;

a lattice mismatched active layer with a first lattice constant which is 0.5% to 2.0% larger than the prescribed lattice constant of the substrate in the double heterostructure section for radiating the laser beam, an energy band-gap of the lattice mismatched active layer being smaller than that of a crystal with the prescribed lattice constant from which the laser beam is radiated;

a lattice mismatched cladding layer with a second lattice constant which is 0.2% to 2.0% smaller than the prescribed lattice constant of the substrate for confining the injected carriers in the active layer, the lattice mismatched cladding layer being arranged on one side of the active layer in the double heterostructure section and an energy band-gap of the lattice mismatched cladding layer being larger than that of a crystal with the prescribed lattice constant which confines the injected carriers in the active layer; and a cladding layer arranged on another side of the active layer in the double heterostructure section for confining the injected carriers in the active layer by co-operating with the lattice mismatched cladding layer.

As is well known, an energy band-gap between a conduction band and a valence band is shifted by changing the composition of a material of either an active layer or a cladding layer.

For example, in cases where a $In_{1-y}(Ga_{1-x}Al_x)_y P$ type of materials where $0 \leq X < 1$ and $0 \leq Y < 1$ are satisfied are utilized as a material of the semiconductor laser device, the energy band-gap is decreased when a composition ratio $1-Y$ of Indium In is increased. On the contrary, the energy band-gap is increased when a composition ratio $1-Y$ of Indium In is decreased.

In the above construction of the semiconductor laser device, the lattice constant of the active layer is increased so as to be set at a larger value than that of the substrate by changing the composition of the active layer. Therefore, the energy band-gap in the active layer is decreased.

On the contrary, the lattice constant of the lattice mismatched cladding layer is decreased so as to be set at a smaller value than that of the substrate by changing the composition of the cladding layer. Therefore, the energy band-gap in the lattice mismatched cladding layer is increased.

Accordingly, the energy barrier indicated by the difference between the energy band-gap of the active layer and the energy band-gap of the cladding layer is increased so that the carriers injected in the active layer can be efficiently confined regardless of whether the active layer is thinned or is heated up. That is, the laser intensity can be kept to a high value regardless of whether the operating temperature is raised.

Moreover, as for the generation of the misfit dislocations or the growth of undesirable lattice defects resulting from the stress, the stress generated in the semiconductor laser device is disappeared. The reason is as follows.

An extended power is generated by the lattice mismatched active layer to latently generate a stress because the lattice constant of the active layer is larger than that of the substrate, while a compressive power is generated by the cladding layer to latently generate another stress because the lattice constant of at least one of the cladding layers is smaller than that of the substrate. The extended power and the compressive power are disappeared because the directions of both powers are opposite to each other.

Therefore, no warp and no deformation is generated in the semiconductor laser device. Moreover, no stress field is generated because no stress is generated outside the vicinity of the active layer so that the undesirable lattice defects such as the misfit dislocations existing in the substrate and having a tendency to move along the stress field are not moved into the active layer from the substrate.

Accordingly, the first object is achieved because the semiconductor laser device with no lattice defect can be reliably obtained.

Moreover, the first object is achieved by the provision of a semiconductor laser device for radiating a laser beam from a double heterostructure section in which injected carriers having an energy source of the laser beam are confined, comprising:

a compound semiconductor substrate with a prescribed lattice constant for loading the double heterostructure section;

a lattice mismatched active layer with a first lattice constant which is 0.3% to 2.5% larger than the prescribed lattice constant of the substrate in the double heterostructure section for radiating the laser beam, an energy band-gap of the lattice mismatched active layer being smaller than that of a crystal with the prescribed lattice constant from which the laser beam is radiated;

a first cladding layer with no natural superlattice regularly directed in a <111> direction for confining the injected carrier in the active layer, the first cladding layer being grown on one side of the lattice mismatched active layer at an epitaxial junction and an energy band-gap of the first cladding layer being larger than that of a crystal with the natural superlattice which confines the injected carriers in the active layer; and a second cladding layer grown on another side of the active layer in the double heterostructure section for confining the injected carriers in the active layer by cooperating with the first cladding layer.

As is well known, in cases where a $In_{1-y}(Ga_{1-x}Al_x)_y P$ type of materials where $0 \leq X < 1$ and $0 \leq Y < 1$ are satisfied are utilized as a material of the semiconductor laser device, the natural superlattice regularly directed in a <111> direction is easily formed by changing growing conditions such as a growth temperature and the ratio V/III of the V-family material to the III-family material. For example, the growth of the natural superlattice is described in a literature "J. Crystal growth 93 (1988) p. 406".

In case of the utilization of the $In_{1-y}(Ga_{1-x}Al_x)_yP$ type of materials, the materials InP, GaP, and AlP are laminated on the substrate in turn in the <111> direction at an epitaxial junction. Therefore, the lattice matching is guaranteed between the laminated $In_{1-y}(Ga_{1-x}Al_x)_yP$ layer and the substrate. That is, the natural superlattice regularly directed in a <111> direction is formed.

In this case, in general, the energy band-gap of the $In_{1-y}(Ga_{1-x}Al_x)_yP$ layer with the natural superlattice is reduced. Therefore, the energy band-gap is small as compared with that of the $In_{1-y}(Ga_{1-x}Al_x)_yP$ layer with no natural superlattice.

In the above structure of the semiconductor laser device, the first cladding layer has no natural superlattice by adjusting the growing conditions. Therefore, the energy band-gap of the first cladding layer is large as compared with that of the conventional cladding layer with the natural superlattice.

Moreover, the lattice constant of the active layer is increased so as to be set at a larger value than that of the substrate by changing the composition of the active layer. Therefore, the energy band-gap in the active layer is decreased.

Therefore, the energy barrier indicated by the difference between the energy band-gap of the active layer and the energy band-gap of the cladding layer is increased.

Accordingly, the carriers injected in the active layer can be efficiently confined regardless of whether the active layer is thinned or is heated up. That is, the light intensity can be maintained at a high value regardless of whether the operating temperature is raised.

The second object is achieved by the provision of a semiconductor laser device for radiating a laser beam by confining injected carriers having an energy source of the laser beam, comprising:

a compound semiconductor substrate which is formed by a crystal with a prescribed lattice constant and has a specific plane direction which leans by a prescribed angle toward a predetermined direction equivalent to a <011> direction from a (100) plane;

a first cladding layer grown on the substrate at an epitaxial junction;

a lattice mismatched active layer with a first lattice constant which is 0.5% to 2.0% larger than the prescribed lattice constant of the substrate for radiating the laser beam, (1) the active layer being grown on the first cladding layer at an epitaxial junction, and (2) an energy band-gap of the lattice mismatched active layer being smaller than that of a crystal with the prescribed lattice constant in which the laser beam is radiated; and a second cladding layer grown on the active layer at an epitaxial junction for confining the injected carriers in the active layer by co-operating with the first cladding layer.

In the above structure of the semiconductor laser device, the lattice constant of the active layer is increased so as to be set at a larger value than that of the substrate by varying the composition of the active layer. Therefore, the energy band-gap in the active layer is decreased.

Accordingly, the energy barrier between the active layer and the cladding layer is increased. Therefore, the carriers injected in the active layer can be efficiently confined regardless of whether the active layer is thinned or is heated up. That is, the light intensity can be maintained at a high value regardless of whether the operating temperature is raised.

On the other hand, the double heterostructure section is formed on the substrate at an epitaxial junction. Therefore, a growing direction of the active layer and the cladding layers are shifted because the substrate has the specific plane direction which leans by the prescribed angle toward the predetermined direction equivalent to the <011> direction from the (100) plane.

As a result, the energy band-gap in the double heterostructure section is increased. In detail, the decreased energy band-gap in the active layer is compensated so that the laser beam with a shortened wavelength can be radiated from the active layer. In addition, the increased energy barrier can be maintained to a large value. Therefore, the temperature characteristics of the semiconductor laser device is maintained.

In addition, because the lattice constant of the active layer is increased as compared with that of the substrate, a stress is added to the active layer to some extent. Therefore, the effective mass of positive holes positioned in a valence band is lessened when the positive holes are moved toward the surface direction of the active layer.

Accordingly, the diffusion length of the positive holes is lengthened when the positive holes are moved toward the surface direction of the active layer. Therefore, the hole-burning phenomenon can be avoided so that a kink phenomenon is not generated. That is, the lateral mode radiation of the laser beam can be stably implemented without the kink phenomenon regardless of whether the intensity of the laser beam is high.

BRIEF DESCRIPTION OF THE DRAWINGS

FIG. 4 shows the relation between the lattice mismatches $\Delta a/a$ and the compositions $In_{1-y}(Ga_{1-x}Al_x)_yP$ and the relation between the lattice mismatch $\Delta a/a$ and energy band-gap Eg in tabular form.

FIG. 19 is a conceptual cross sectional view of a semiconductor laser device according to a third modification of the present invention, showing lattice mismatch in an active layer.

FIG. 21 is a graphic view showing the characteristic shift of the energy band-gaps in the active layer 154 and the cladding layers 155, 156 in cases where the specific plane direction leaning from the (100) plane direction is shifted in the range from 0° to over 20°.

DETAILED DESCRIPTION OF THE PREFERRED EMBODIMENTS

Preferred embodiments of a semiconductor laser device according to a first modification of the present invention are described with reference to drawings.

Figure 3:
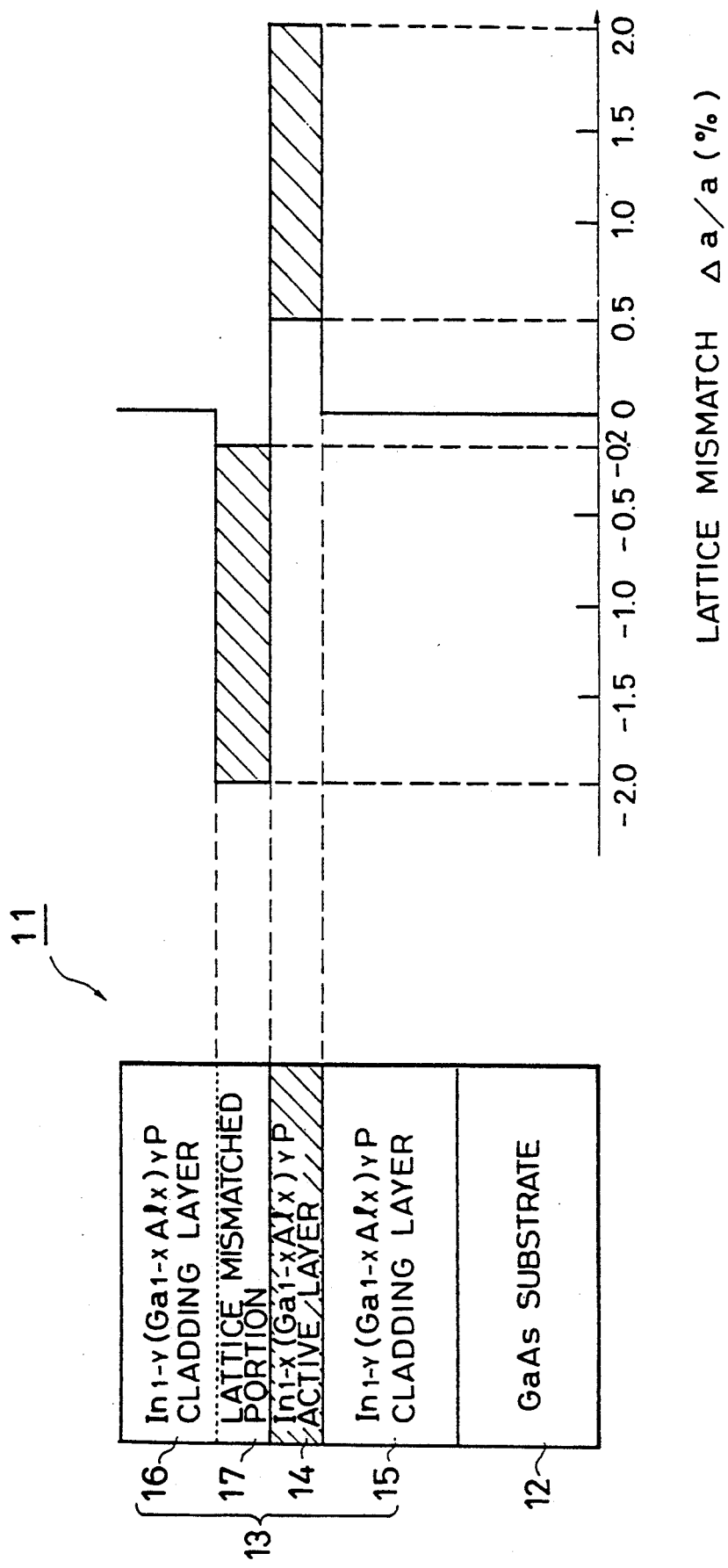
FIG. 3 is a conceptual cross sectional view of a semiconductor laser device according to a first modification of the present invention, showing lattice mismatch in a double-heterostructure section of the device.

FIG. 3 is a conceptual cross sectional view of a semiconductor laser device according to a first modification of the present invention, showing lattice mismatch in a double-heterostructure section of the device.

As conceptually shown in FIG. 3, a semiconductor laser device 11 comprises a GaAs substrate 12 and a double-heterostructure section 13 mounted on the substrate 12 at an epitaxial junction.

The double-heterostructure section 13 comprises:

an $In_{1-y}(Ga_{1-x}Al_x)_yP$ type of active layer 14 for radiating a laser beam; and a pair of $In_{1-y}(Ga_{1-x}Al_x)_yP$ type of cladding layers 15, 16 arranged on both sides of the active layer 14 for confining injected carriers in the active layer 14, an energy band-gap of each cladding layer 15 (16) being larger than that of the active layer 14.

The substrate 12, the active layer 14, and the cladding layers 15, 16 are successively grown by an epitaxy growth technique.

One of the cladding layers 15, 16 is formed by an n type conductive crystal and another cladding layer is formed by a p type conductive crystal. Therefore, an energy barrier is generated between the active layer 14 and the cladding layer 15 (16) so that the carriers injected in the semiconductor laser device 11 through the cladding layers 15, 16 are confined in the active layer 14.

The lattice constant of the active layer 14 is 0.5% to 2.0% larger than that of the substrate 12.

In addition, one of the cladding layers is provided with a lattice mismatched portion 17 in a region adjacent to the active layer 14. The lattice constant of the lattice mismatched portion 17 is 0.2% to 2.0% smaller than that of the substrate 12. The portion 17 is arranged in the cladding layer 16 in the first modification. Lattice constants of both the cladding layer 15 and the cladding layer 16 other than the portion 17 are substantially the same as that of the substrate 12.

The relation between the lattice mismatch $\Delta a/a$ and the composition $In_{1-y}(Ga_{1-x}Al_x)_yP$ and the relation between the lattice mismatch $\Delta a/a$ and energy band-gap Eg are shown in FIG. 4.

As shown in FIG. 4, the lattice mismatch Δa/a of the active layer 14 is increased as the composition ratio 1−Y of the Indium is increased. That is, the lattice mismatching with the substrate 12 is increased toward a positive value by the increase of the ratio 1−Y. Moreover, the energy band-gap is decreased as the composition ratio 1−Y of the Indium is increased.

In addition, the lattice mismatch Δa/a of the cladding layers 15, 16 are decreased toward negative values by the decrease of the ratio 1−Y. Moreover, the energy band-gap is increased by the decrease of the ratio 1−Y.

Figure 1:
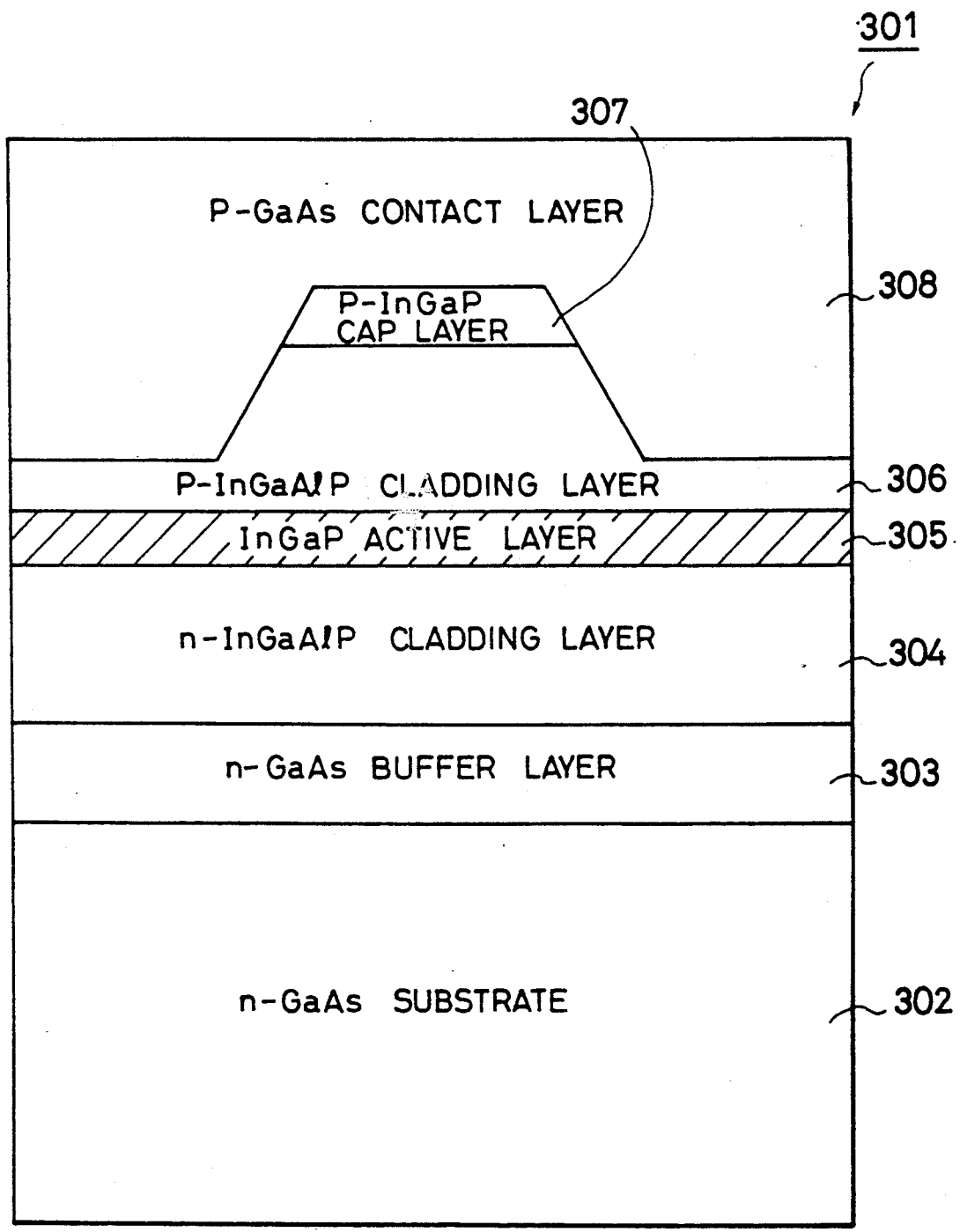
FIG. 1 is a schematic cross sectional view of a ridge waveguide type of InGaAlP semiconductor laser device with a conventional structure for controlling the lateral mode.

Therefore, the energy gap between the active layer 14 and the lattice mismatched portion 17 is increased as compared with that in the conventional semiconductor laser device 301 shown in FIG. 1.

Accordingly, the carriers confined in the active layer 14 cannot leak to the lattice mismatched portion 17 because of the large energy barrier. In general, electrons confined in an active layer are easily leaked to a p type cladding layer. Therefore, in cases where the conductive type of the portion 17 is a p type, the leak of the electrons can be efficiently prevented.

Figure 5:
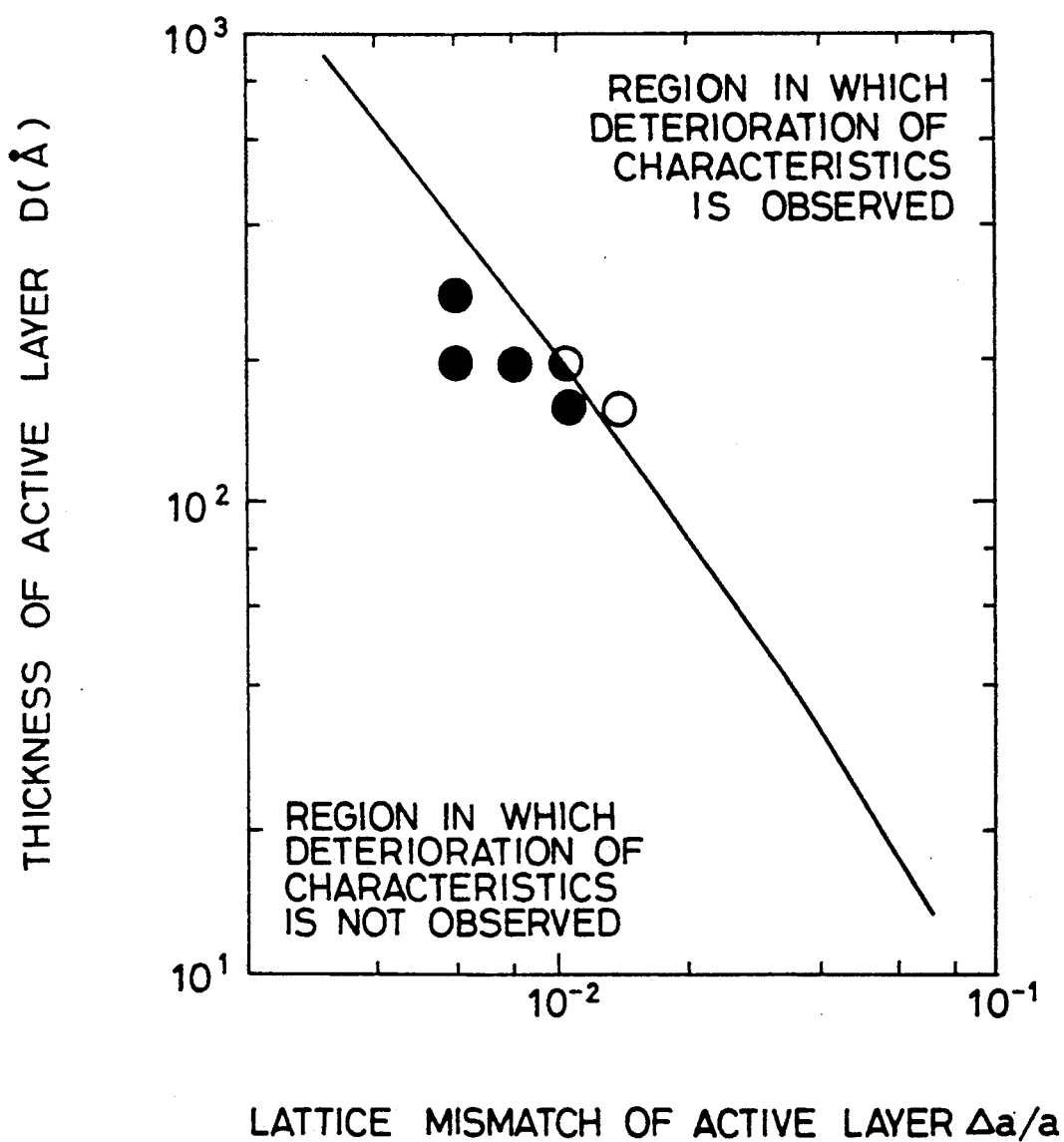
FIG. 5 is a graphic view of the relation between the thickness D and the lattice mismatch $\Delta a/a$, showing the conditions that the characteristics such as the confining efficiency of the injected carriers in the semiconductor laser device 21 deteriorates by the generation of the lattice defects such as the misfit dislocations.

Experimental results indicating the relation between the thickness D of the active layer 14 and the lattice mismatch Δa/a in the active layer 14 are shown in FIG. 5.

FIG. 5 is a graphic view of the relation between the thickness D and the lattice mismatch Δa/a, showing the conditions that the characteristics such as the confining efficiency of the injected carriers in the semiconductor laser device 11 deteriorate by the generation of the lattice defects such as the misfit dislocations.

As shown in FIG. 5, the experimental results in which the deterioration of the characteristics is observed are represented by white circles, while the experimental results in which the deterioration of the characteristics is not observed are represented by black circles.

Moreover, the boundary of the generation of the deterioration is theoretically represented by a curved solid line according to the experimental results.

In short, the deterioration of the characteristics is generated in a region in which both the thickness D (Å) of the active layer 14 and the lattice mismatch Δa/a are large together.

Therefore, the lattice mismatch Δa/a in the active layer 14 must satisfy the following condition $$0 < \Delta a/a \times 100 \, (\%) \leq 200/D \quad (1)$$

to obtain a high density of stable laser beam.

In the same manner, the deterioration of the characteristics such as the confinement of the injected carrier is generated in the lattice mismatched portion 17 of the cladding layer 16.

Therefore, the lattice mismatch Δa/a in the lattice mismatched portion 17 must satisfy the following condition $$-200/T < \Delta a/a \times 100 \, (\%) \leq 0 \quad (2)$$

to obtain a high density of stable laser beam. Here, the symbol T (Å) represents the thickness of the lattice mismatched portion 17.

In cases where the conditions represented by the equations (1), (2) are satisfied, the laser beam can be stably radiated from the semiconductor laser device 11 regardless of whether the device 11 is operated for a long time.

Specifically, a radiative threshold is largely decreased in a range of $0.5 \leq \Delta a/a \times 100 \leq 1.0\%$ in cases where the thickness of the active layer 17 is D=0.02 μm (200 Å). In the same manner, the radiative threshold is largely decreased in a range of $0.75 \leq \Delta a/a \times 100 \leq 1.5\%$ in cases where the thickness of the active layer 17 is D=0.015 μm (150 Å). In addition, the intensity of the laser beam is largely increased in the above ranges. Here, the radiative threshold means the minimum current applied to the semiconductor laser device 11 to radiative the laser beam.

On the other hand, the lattice mismatch Δa/a in the active layer 14 is limited to $0.2 \leq \Delta a/a \leq 2\%$ because of the following reasons.

In cases where the lattice mismatch Δa/a in the active layer 14 is increased, the upper limit of the thickness D of the active layer 14 is decreased as shown in FIG. 5. The injected carriers cannot be effectively confined in the active layer 14 in a range less than D=0.01 μm (100 Å) according to the quantum theory. Therefore, the upper limit of the lattice mismatch Δa/a in the active layer 14 is 2%.

Moreover, the manufacture of the active layer 14 in which the lattice mismatch is large rapidly becomes difficult when the film thickness of the active layer 14 is increased. Therefore, the upper limit of the thickness of the active layer 14 is 0.1 μm (1000 Å) so that the lower limit of the lattice mismatch Δa/a is 0.2%.

In the same manner, the lattice mismatch Δa/a in the cladding layer 30 is limited to $0.2 \leq \Delta a/a \leq 2\%$.

As the other feature of the first modification, the improvement of the kink level is described.

In general, the band structure of the active layer 14 is shifted by the local stress generated in the boundary region between the active layer 14 and the lattice mismatched portion 17 so that the effective mass of the positive hole moving along the surface direction of the active layer 14 is decreased.

Moreover, both the density of the injected carriers and the operating temperature generally influence on the energy difference between an edge of a band occupied by the positive holes of which the effective mass is light and an edge of another band occupied by the positive holes of which the effective mass is heavy. The energy difference must be large to improve the kink level. In cases where the lattice mismatch of the active layer 14 is equal to or more than 0.5%, the energy difference becomes large enough to improve the kink level. That is, the thickness D of the active layer 14 must be equal to or less than 400 Å to satisfy the equation (1). Especially, in cases where the lattice mismatch of the active layer 14 is equal to or more than 0.6%, the energy difference is sufficiently large so that the improvement of the kink level can be reliably achieved.

Accordingly, the diffusion length of the positive hole can be enlarged along the surface direction of the active layer 14 so that the generation of the kink phenomenon resulting from the hole-burning phenomenon can be reduced. As a result, the lateral mode of the laser beam can be stable when the laser beam is radiated in a high intensity. That is, the semiconductor laser device 11 can be utilized as a laser source to store information in an optical disk in a high density.

On the other hand, because the energy barrier between the energy band-gap in the active layer 14 and the energy band-gap in the lattice mismatched portion 17 is increased, the carriers cannot leak from the active layer 14 to the cladding layers 15, 16 although the carriers obtain the high energy at a high operating temperature. Therefore, the temperature characteristics of the device 11 are improved.

Specifically, the temperature characteristics of the device 11 primarily depend on the overflow of the electrons leaking from the active layer 14 to the p type cladding layer. Therefore, in cases where the conductive type of the lattice mismatched portion 17 is a p type, the temperature characteristics of the device 11 are largely improved.

Moreover, the thickness of the lattice mismatched portion 17 is required to be equal to or more than 100 Å because the electrons in the active layer 14 are prevented from transmitting through the lattice mismatched portion 17 according to the tunnel effect.

As the other feature of the first modification, the generation of the misfit dislocations or the growth of undesirable lattice defects resulting from the stress is described.

In short, the stress generated in the semiconductor laser device 11 is disappeared. The reason is as follows.

An extended power is generated by the lattice mismatched active layer 14 to latently generate a stress because the lattice constant of the active layer 14 is larger than that of the substrate 12, while a compressive power is generated by the lattice mismatched portion 17 to latently generate another stress because the lattice constant of the lattice mismatched portion 17 is smaller than that of the substrate 12. The extended power and the compressive power are disappeared because the directions of both powers are opposite to each other.

Therefore, no warp and no deformation is generated in the semiconductor laser device 11. Moreover, no stress field is generated in the device 11 because no stress is generated so that the undesirable lattice defects such as the misfit dislocations existing in the substrate 12 and having a tendency to move along the stress field are not moved into the active layer 14 from the substrate 12.

Accordingly, the semiconductor laser device 11 with no lattice defect can be reliably obtained.

Accordingly, the semiconductor laser device 11 with no lattice defect can be reliably obtained.

Specifically, in cases where the absolute value of the extended power agrees with the absolute value of the compressive power, the stress is completely disappeared. That is, both the film thickness D of the active layer 14 and the film thickness T of the lattice mismatched portion 17 are set to satisfy the following condition $$D \times (\Delta a/a)_{active} + T \times (\Delta a/a)_{clad} = 0. \quad (3)$$

where the symbol $(\Delta a/a)_{active}$ represents the lattice mismatch of the active layer 14, the symbol $(\Delta a/a)_{clad}$ represents the lattice mismatch of the lattice mismatched portion 17, the first term $D^*(\Delta a/a)_{active}$ is proportional to the extended power, and the second term $T^*(\Delta a/a)_{clad}$ is proportional to the compressive power.

Next, a ridge waveguide type of $In_{1-y}(Ga_{1-x}Al_x)_yP$ semiconductor laser device in which the lattice mismatch of the active layer 14 is set to $+1.0\%$ and the lattice mismatch of the lattice mismatched portion 17 of the cladding layer 16 is set to $-0.5\%$ is described with reference to FIG. 6.

Figure 6:
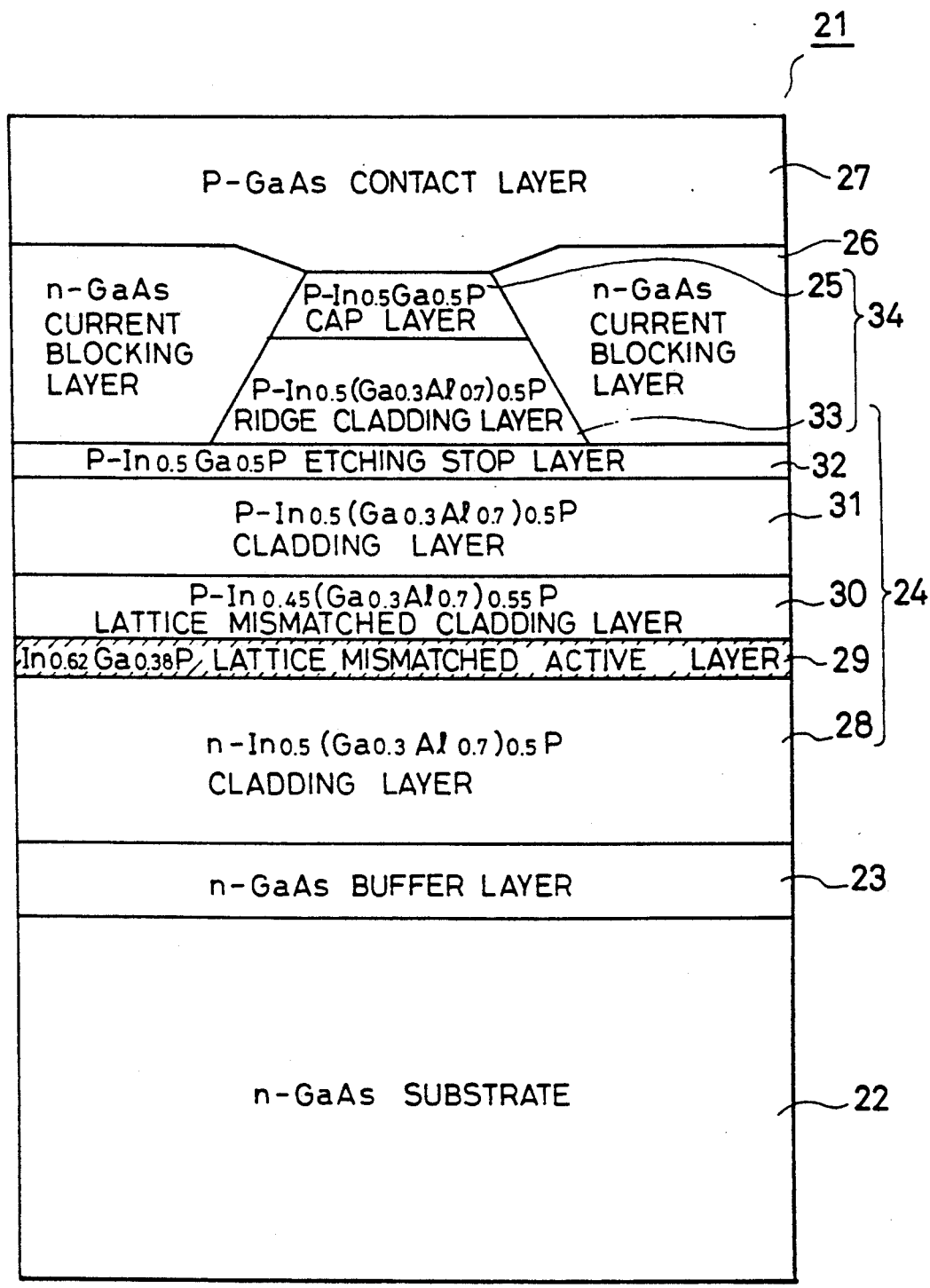
FIG. 6 is a schematic cross sectional view of a $In_{1-y}(Ga_{1-x}Al_x)_yP$ type of semiconductor laser device according to a first embodiment of the first modification.

FIG. 6 is a schematic cross sectional view of a $In_{1-y}(Ga_{1-x}Al_x)_yP$ type of semiconductor laser device according to a first embodiment of the first modification.

As shown in FIG. 6, a ridge waveguide type of $In_{1-y}(Ga_{1-x}Al_x)_yP$ semiconductor laser device 21 comprises:

a substrate 22 formed by an n type GaAs crystal;
a buffer layer 23 formed by an n type GaAs crystal and mounted on the substrate 22;
a double-heterostructure section 24 mounted on the buffer layer 23;
a cap layer 25 formed by a p type $In_{0.5}Ga_{0.5}P$ crystal and mounted on the section 24;
a current blocking layer 26 formed by an n type GaAs crystal and mounted on the section 24; and
a contact layer 27 formed by a p type GaAs crystal and mounted on both the cap layer 25 and the current blocking layer 26.

The double-heterostructure section 24 comprises:
an n type cladding layer 28 formed by an n type $In_{0.5}(Ga_{0.3}Al_{0.7})_{0.5}P$ crystal and mounted on the buffer layer 23;
a lattice mismatched active layer 29 formed by a $In_{0.62}Ga_{0.38}P$ crystal and mounted on the cladding layer 28;
a p type lattice mismatched cladding layer 30 formed by a p type $In_{0.45}(Ga_{0.3}Al_{0.7})_{0.55}P$ crystal and mounted on the active layer 29;
a p type cladding layer 31 formed by a p type $In_{0.5}(Ga_{0.3}Al_{0.7})_{0.5}P$ crystal and mounted on the cladding layer 30;
a p type etching stop layer 32 formed by a p type $In_{0.5}Ga_{0.5}P$ crystal and mounted on the cladding layer 31; and
a ridge cladding layer 33 formed by a p type $In_{0.5}(Ga_{0.3}Al_{0.7})_{0.5}P$ crystal and mounted on the etching stop layer 32, a ridge section 34 being shaped by both the cap layer 25 and the ridge cladding layer 33.

Impurity Zn is doped in the semiconductor device 21 to make the p type cladding layers 30, 31, 32, and 33 by the concentration of $1 \times 10^{18}$ atoms/cm$^{-3}$. In addition, impurity Si is doped in the semiconductor device 21 to make the n type cladding layer 28 by the concentration of $1 \times 10^{17}$ atoms/cm$^{-3}$.

The substrate 22, the buffer layer 23, and the double-heterostructure section 24 are successively grown by an epitaxy growth technique.

The composition $In_{0.62}Ga_{0.38}P$ of the active layer 29 is obtained by setting Al ratio at $X=0$ and Ga ratio at $Y=0.38$ in the $In_{1-y}(Ga_{1-x}Al_x)_yP$ expression. In addition, the composition $In_{0.45}(Ga_{0.3}Al_{0.7})_{0.55}P$ of the cladding layer 30 is obtained by setting Al ratio at $X=0.7$ and Ga ratio at $Y=0.55$ in the $In_{1-y}(Ga_{1-x}Al_x)_yP$ expression.

The lattice mismatched active layer 29 corresponds to the active layer 14 shown in FIG. 3. The lattice mismatched cladding layer 30 corresponds to the portion 17 of the cladding layer 16 shown in FIG. 3.

As for the lattice constant in the device 21, the lattice constant of the lattice mismatched active layer 29 is 1.0% larger than that of the substrate 22 because the composition of the active layer 29 is $In_{0.62}Ga_{0.38}P$. The lattice constant of the lattice mismatched cladding layer 30 is 0.5% smaller than that of the substrate 22 because the composition of the cladding layer 30 is $In_{0.45}(Ga_{0.3}Al_{0.7})_{0.55}P$.

Therefore, the thickness of the active layer 29 is set to 0.015 μm (150 Å) so as to satisfy the condition represented by the equation (1). Moreover, the thickness of the cladding layer 30 is set to 0.02 μm (200 Å) so as to satisfy the condition represented by the equation (2).

The lattice mismatches of both the active layer 29 and the cladding layer 30 are confirmed by utilizing a photoluminescence wavelength analysis, X-ray diffraction, or a transmission electron microscope.

Because In composition ratio $1-Y$ is increased as compared with the conventional In composition ratio $1-Y=0.5$, the energy band-gap in the active layer 29 is smaller than that in the conventional active layer 305, shown in FIG. 1, formed by $In_{0.5}Ga_{0.5}P$ of which the lattice constant is substantially the same as that of the substrate 22.

On the other hand, the energy band-gap in the cladding layer 30 is larger than that in the crystal formed by $In_{0.5}(Ga_{0.3}Al_{0.7})_{0.5}P$ because In composition ratio $1-Y$ is decreased as compared with the conventional In composition ratio $1-Y=0.5$.

Therefore, the energy barrier indicated by the difference between the energy band-gap in the active layer 29 and the energy band-gap in the cladding layer 30 is increased so that the electrons confined in the active layer 29 are prevented from being leaked to the p type cladding layer 30.

In the above structure of the ridge waveguide type of $In_{1-y}(Ga_{1-x}Al_x)_yP$ semiconductor laser device 21, carriers injected in the device 21 are confined in the center of the active layer 29 because the conductive type of the current blocking layer 26 is inverted. Therefore, luminescence is implemented by recombination of an electron and a positive hole in the active layer 29 right below the ridge section 34. At this time, lights generated by the luminescence are efficiently confined in the active layer 29 by the difference in the refractive index between the active layer 29 and the outside of the active layer 29. Therefore, the intensity of the lights is raised up because the energy barrier between the active layer 29 and the cladding layer 30 is increased by the lattice mismatch in both the active layer 29 and the cladding layer 30. Thereafter, a laser beam is emitted from the active layer 29 in a high intensity because the electrons cannot leak to the cladding layer 60 by the large energy barrier regardless of whether or not the operating temperature is high.

Accordingly, the carriers injected in the device 21 are efficiently confined in the active layer 29 regardless of whether the active layer 29 is thinned.

Figure 7:
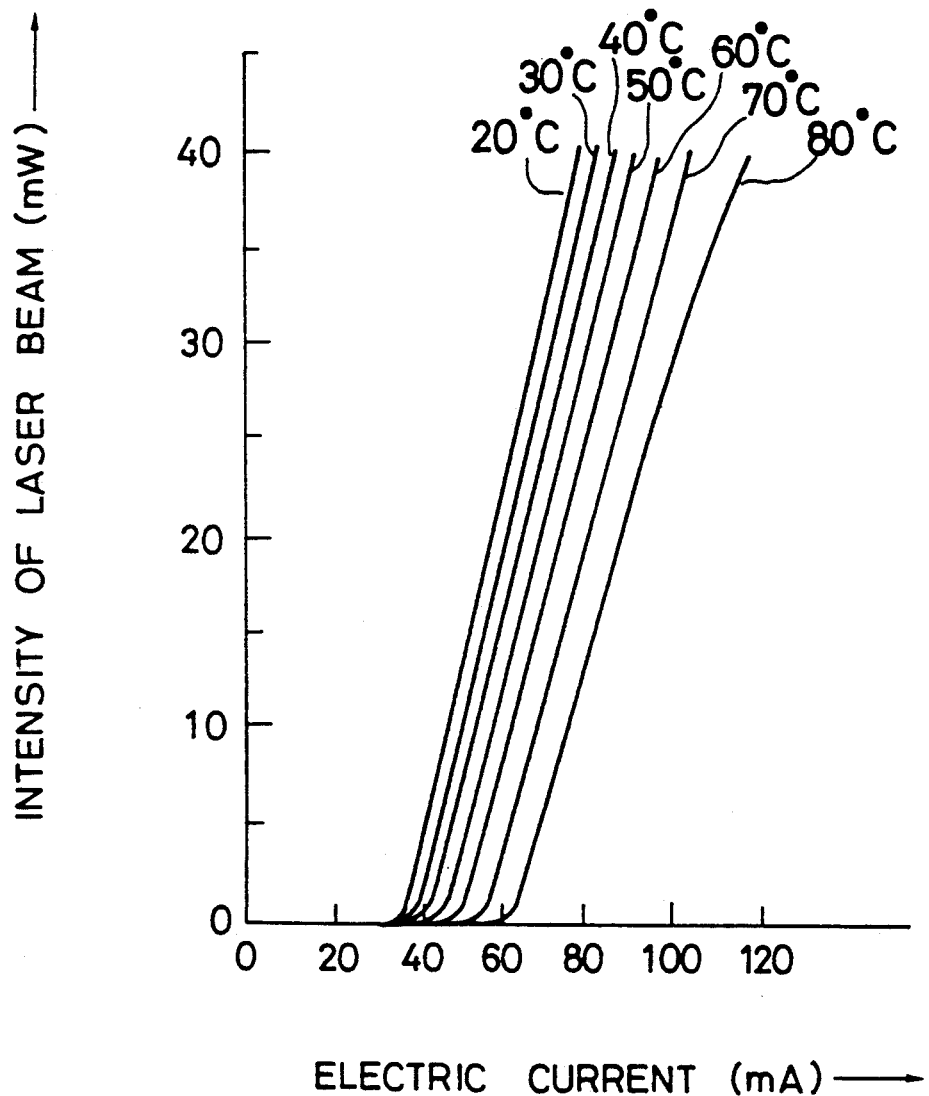
FIG. 7 is a graphic view of the relation between the electric current and the intensity of the laser beam in the semiconductor laser device 21.

FIG. 7 is a graphic view of the relation between the electric current and the intensity of the laser beam in the semiconductor laser device 21.

Figure 2:
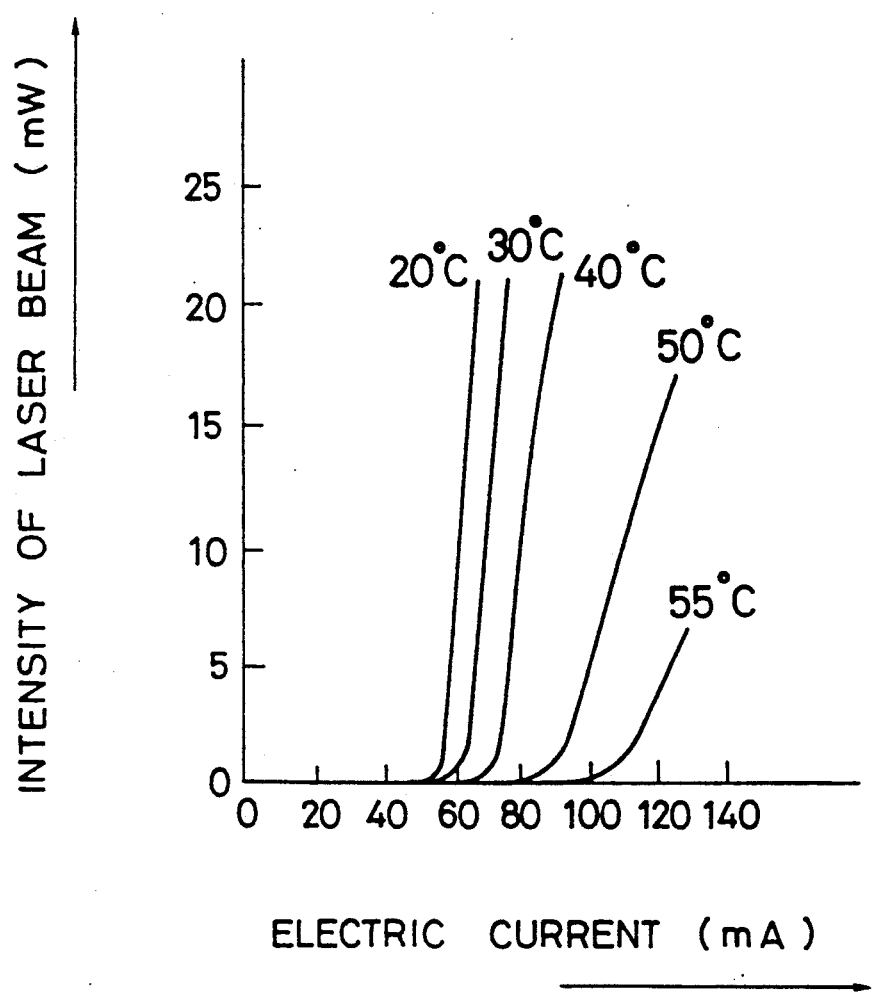
FIG. 2 is a graphic view showing temperature dependence of characteristics between the electric current (mA) and the light intensity (mW) in the semiconductor laser device shown in FIG. 1.

As shown in FIG. 7, the intensity of the laser beam is linearly increased up to 40 mW. In addition, the linearity is maintained at an operating temperature up to 80° C. Therefore, the high intensity of the laser beam can be obtained at a high operating temperature because the temperature characteristics of the semiconductor laser device 21 are superior. In detail, the radiative threshold of the electric current is only 60 mA at a temperature of 80° C., while the intensity of the laser beam is extremely decreased at a temperature over 40° C. in the conventional device 301 as shown in FIG. 2.

Moreover, the kink level is over 100 mW in the semiconductor laser device 21 (not shown in FIG. 7), while the kink phenomenon is generated when the intensity of the laser beam is at 43 mW in the conventional device 301 shown in FIG. 1.

Moreover, the radiative threshold of the electric current is not increased so much and a differential quantum efficiency is improved.

The reason why the kink level is improved is that the effective mass of the positive hole existing in the valence band is decreased when the positive holes are moved along the surface direction of the active layer 29 because the composition ratio of Ga in the active layer 29 is set at $Y=0.38$ in the $In_{1-y}Ga_yP$ material to increase the lattice constant of the active layer 29 which is 1.0% larger than that of the substrate 22.

The above mentioned superior effects such as the high intensity of the laser beam at a high temperature in the semiconductor laser device 21 can be obtained in a semiconductor laser device comprising the substrate 22, an n type buffer layer formed by a InGaP type of crystal and mounted on the substrate 22, the cladding layers 28, 30, the active layer 29, the cladding layer 31 of which the thickness is from 0.1 μm (1000 Å) to 0.4 μm (4000 Å), a p type etching stop layer formed by a InGaAlP, GaAlAs, or GaAs type of crystal and mounted on the cladding layer 31, the cladding layer 33, a p type cap layer formed by a InGaAlP, GaAlAs, or GaAs type of crystal and mounted on the cladding layer 33, a current blocking layer formed by a semi-insulation GaAs or n type- or semi-insulation GaAlAs type of crystal and mounted on the etching stop layer, and the contact layer 27.

Moreover, the superior effects can be obtained in a semiconductor laser device provided with a lattice mismatched active layer fabricated by a quantum well structure formed by both a quantum well layer and a barrier layer in place of the active layer 29 in the semiconductor laser device 21.

In the first embodiment of the first modification, the energy band-gap of the active layer 29 is shifted by shifting the lattice mismatch of the active layer 29 to obtain the laser beam with high intensity. However, the means for shifting the energy band-gap of the active layer 29 is not limited to the shift of the lattice mismatch. That is, in cases where the active layer is formed by a $In_{1-y}(Ga_{1-x}Al_x)_yP$ type of material, the energy band-gap of the active layer can be shifted by shifting the composition X of Al. Moreover, the energy band-gap of the active layer can be shifted by changing the crystal growing condition to shift the arrangement of the atoms.

However, it is difficult to manufacture a p type crystal with a low resistance when the composition ratio X is over 0.7. Therefore, there are drawbacks that the resistance of the device is increased and the operating voltage is increased.

The temperature characteristics of the device can be improved by utilizing only the negative lattice mismatch of the cladding layer 30 without the lattice mismatch of the active layer. However, The improvement of the temperature characteristics in the semiconductor laser device 21 is superior to that of the above device utilizing only the negative lattice mismatch of the cladding layer 30 because the energy barrier is large in the device 21.

Next, a second modification of the present invention is described.

Figure 8:
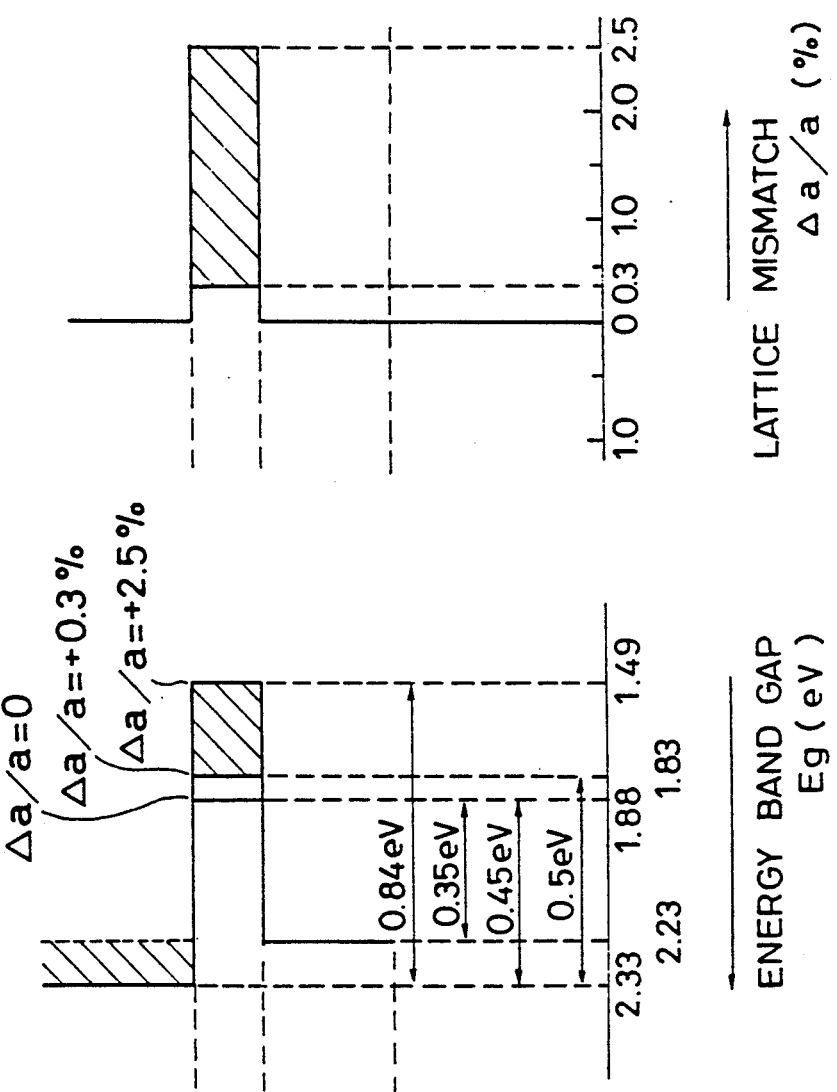
FIG. 8 is a conceptual cross sectional view of a semiconductor laser device according to a second modification of the present invention, showing lattice mismatch in an active layer and energy band gaps in both a p type cladding layer and the active layer.

FIG. 8 is a conceptual cross sectional view of a semiconductor laser device according to a second modification of the present invention, showing lattice mismatch in an active layer and energy band gaps in both a p type cladding layer and the active layer.

As conceptually shown in FIG. 8, a semiconductor laser device 41 comprises:

a GaAs substrate 42 of which the crystal is cleaved to orient along a (100) plane direction expressed by the Miller indices, and a double-heterostructure section 43 mounted on the substrate 42, the section 43 making an epitaxial junction with the substrate 42.

The double-heterostructure section 43 comprises:

an $In_{1-y}Ga_yP$ type of active layer 44 for radiating a laser beam;

an $In_{1-y}(Ga_{1-x}Al_x)_yP$ type of n type cladding layer 45 arranged on one side of the active layer 44 for confining injected carriers in the active layer 44; and an $In_{1-y}(Ga_{1-x}Al_x)_yP$ type of p cladding layer 46 arranged on another side of the active layer 44 for confining injected carriers in the active layer 44 by cooperating with the n type cladding layer 45.

The substrate 42, the active layer 44, and the cladding layers 45, 46 are successively grown by an epitaxy growth technique.

The energy band-gap of the cladding layers 45, 46 is larger than that of the active layer 44. Therefore, the carriers injected in the semiconductor laser device 41 through one of the cladding layers are confined in the active layer 44.

The lattice constant of the active layer 44 is 0.3% to 2.5% larger than that of the substrate 42. In other words, the composition ratio $1-Y$ of Indium (In) is in a range from 0.53 to 0.8 as shown in FIG. 4.

The cladding layer 45 is formed in a natural superlattice structure. The cladding layer 46 is not formed in a natural superlattice structure because a manufacturing method for the cladding layer 46 differs from that for the cladding layer 45.

Inventors of the present invention have implemented many experiments to measure the energy band-gap of cladding layers 45, 46 and the active layer 44.

That is, the energy band-gap of the cladding layer 46 with no natural superlattice structure of which the composition is $In_{0.5}(Ga_{0.3}Al_{0.7})_{0.5}P$ is 2.33 eV. The smallest energy band-gap of the cladding layer 45 with the natural superlattice structure oriented toward a <111> direction of which the composition is $In_{0.5}(Ga_{0.3}Al_{0.7})_{0.5}P$ is 2.23 eV. As mentioned hereinafter, the value of the energy band-gap is shifted depending on the growing conditions such as a growing temperature Tg of the cladding layer, a ratio V/III in the mole flow rate of $PH_3$ (V-family material) to a III-family material, and a carrier concentration.

In cases where the composition of a conventional active layer is $In_{0.5}Ga_{0.5}P$ of which the lattice constant agrees with that of the substrate 42, the energy band-gap of the conventional active layer is shifted in a range from 1.85 eV to 1.91 eV (1.88±0.03 eV) depending on the growing conditions.

Therefore, the energy barrier between the conventional active layer with the $In_{8.5}Ga_{0.5}P$ composition and the cladding layer 45 with the natural superlattice structure oriented toward a <111> direction is 0.35 eV (2.23 eV−1.88 eV). The other barrier between the conventional active layer with the $In_{0.5}Ga_{0.5}P$ composition and the cladding layer 46 with no natural superlattice structure is 0.45 eV (2.33 eV−1.88 eV).

In cases where a specific growing condition for forming the conventional active layer 44 with the $In_{0.5}Ga_{0.5}P$ composition of which the energy band-gap agrees with 1.88 eV is Utilized to form the active layer 44 with the $In_{0.53}Ga_{0.47}P$ composition, the lattice constant of the active layer 44 with the $In_{0.53}Ga_{0.47}P$ composition is 0.3 % larger than that of the substrate 42. That is, the energy band-gap of the active layer 44 with the $In_{0.53}Ga_{0.47}P$ composition decreases to 1.83 eV.

In cases where the specific growing condition is utilized to form the active layer 44 with the $In_{0.8}Ga_{0.2}P$ composition, the lattice constant of the active layer 44 with the $In_{0.8}Ga_{0.2}P$ composition is 2.5 % larger than that of the substrate 42. That is, the energy band-gap of the active layer 44 with the $In_{0.53}Ga_{0.47}P$ composition decreases to 1.49 eV.

The energy barrier between the active layer 44 with the $In_{0.53}Ga_{0.47}P$ composition and the cladding layer 46 with no natural superlattice structure is 0.50 eV (2.33 eV−1.83 eV). Therefore, the energy barrier 0.50 eV is 150 meV larger than the energy barrier (2.23 ev−1.88 eV) between the conventional active layer with the $In_{0.5}Ga_{0.5}P$ composition and the cladding layer 45 with the natural superlattice structure.

In the same manner, the energy barrier between the active layer 44 with the $In_{0.8}Ga_{0.2}P$ composition and the cladding layer 46 with no natural superlattice structure is 0.84 eV (2.33 eV−1.49 eV). Therefore, the energy barrier 0.84 eV is 490 meV larger than that between the conventional active layer with the $In_{0.5}Ga_{0.5}P$ composition and the cladding layer 45 with the natural superlattice structure.

Therefore, in cases where the p type cladding layer 46 is grown without forming the natural superlattice structure oriented toward the <111> direction and the lattice constant of the active layer 44 is larger than that of the substrate 42 by shifting the composition thereof, the energy barrier between the active layer 44 and the p type cladding layer 46 increases. That is, the electrons in the active layer 44 can be efficiently confined regardless of whether the active layer 44 is thinned and is heated up.

Next, a ridge waveguide type of $In_{1-y}(Ga_{1-x}Al_x)_yP$ semiconductor laser device in which the lattice mismatch of the active layer 44 is set at +1.0% is described with reference to FIG. 9.

Figure 9:
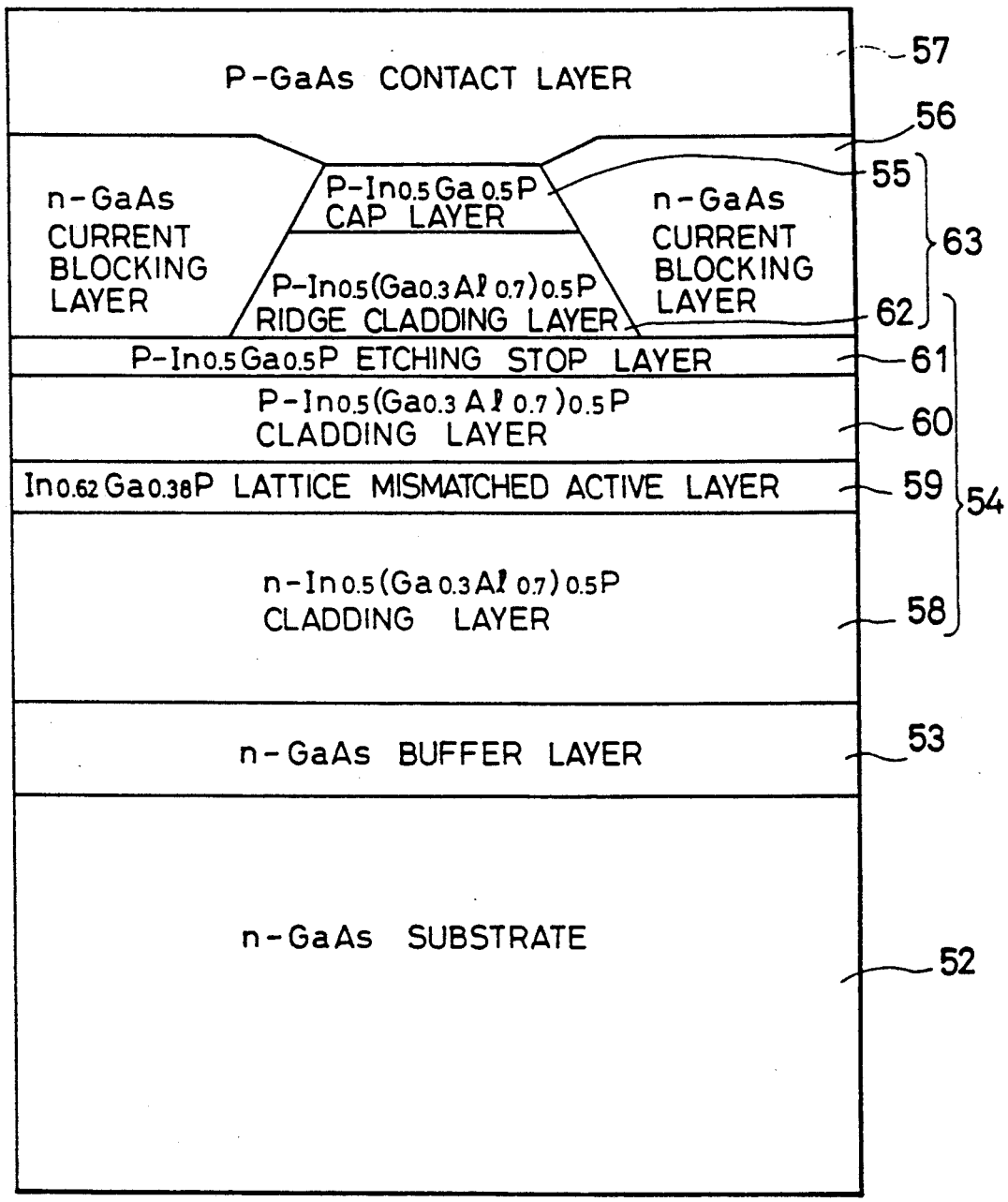
FIG. 9 is a schematic cross sectional view of a $In_{1-y}(Ga_{1-x}Al_x)_yP$ type of semiconductor laser device according to a first embodiment of the second modification.

FIG. 9 is a schematic cross sectional view of a $In_{1-y}(Ga_{1-x}Al_x)_yP$ type of semicondutor laser device according to a first embodiment of the second modification.

As shown in FIG. 9, a ridge waveguide type of $In_{1-y}(Ga_{1-x}Al_x)_yP$ semiconductor laser device 51 comprises:

a substrate 52 formed by an n type GaAs crystal of which the crystal is cleaved to orient along a (100) plane direction expressed by the Miller indices;

a buffer layer 53 formed by an n type GaAs crystal and mounted on the substrate 52;

a double-heterostructure section 54 mounted on the buffer layer 53;

a cap layer 55 formed by a p type $In_{0.5}Ga_{0.5}P$ crystal and mounted on the section 54;

a current blocking layer 56 formed by an n type GaAs crystal and mounted on the section 54; and a contat layer 57 formed by a p type GaAs crystal and mounted on both the cap layer 55 and the current blocking layer 56.

The double-heterostructure section 54 comprises:

an n type cladding layer 58 formed by an n type $In_{0.5}(Ga_{0.3}Al_{0.7})_{0.5}P$ crystal and mounted on the buffer layer 53, the natural superlattice structure being formed in the cladding layer 58;

a lattice mismatched active layer 59 formed by a $In_{0.62}Ga_{0.38}P$ crystal and mounted on the cladding layer 58;

a p type cladding layer 60 formed by a p type $In_{0.5}(Ga_{0.3}Al_{0.7})_{0.5}P$ crystal and mounted on the active layer 59, no natural superlattice structure being formed in the cladding layer 60;

a p type etching stop layer 61 formed by a p type $In_{0.5}Ga_{0.5}P$ crystal and mounted on the cladding layer 60; and a ridge cladding layer 62 formed by a p type $In_{0.5})Ga_{0.3}Al_{0.7})_{0.5}P$ crystal and mounted on the etching stop layer 61, a ridge section 63 being shaped by the cap layer 55 and the ridge cladding layer 62.

Impurity Zn is doped in the semiconductor device 51 to make the p type layers 55, 57, 60, 61, and 62 by the concentration of $1 \times 10^{18}$ atoms/cm$^{-3}$. Moreover, impurity Si is doped in the semiconductor device 51 to make the n type layer 53, 58, 56 and the substrate 52 by the concentration of $1 \times 10^{17}$ atoms/cm$^{-3}$.

The substrate 52, the buffer layer 53, and the double-heterostructure section 54 are successively grown by an epitaxy growth technique such as a reduced-pressure metal-organic CVD (MOCVD) method.

The composition $In_{0.62}Ga_{0.38}P$ of the active layer 59 is obtained by setting Al ratio at X=0 and setting Ga ratio at Y=0.38 in the $In_{1-y}(Ga_{1-x}Al_x)_yP$ expression.

The lattice mismatches of the active layer 59 is confirmed by utillizing a photoluminescence wavelength analysis, an X-ray diffraction, or a transmission electron microscope. That is, the active layer 59 is 0.015 µm thick and the lattice constant of the active layer 59 is 1.0 % larger than that of the substrate 52.

In the above structure of the ridge waveguide type of $In_{1-y}(Ga_{1-x}Al_x)_yP$ semiconductor laser device 51, carriers injected in the device 51 are confined in the center of the active layer 59 because the conductive type of the current blocking layer 56 is inverted against the ridge cladding layer 62. Therefore, luminescence is implemented by recombination of an electron and a positive hole in the active layer 59 right below the ridge section 63. At this time, lights generated by the luminescence are efficiently confined in the active layer 59 because of the difference in the refractive index between the active layer 59 and the outside of the active layer 59. Therefore, the intensity of the lights is efficiently raised up because the energy barrier between the active layer 59 and the cladding layer 60 is increased by the lattice mismatch in the active layer 59 and no formation of the natural superlattice structure in the cladding layer 60. Thereafter, the lights are emitted from the active layer 59 in a high intensity because the electrons cannot leak to the cladding layer 60 by the increased energy barrier regardless of whether or not the operating temperature is high.

Figure 10:
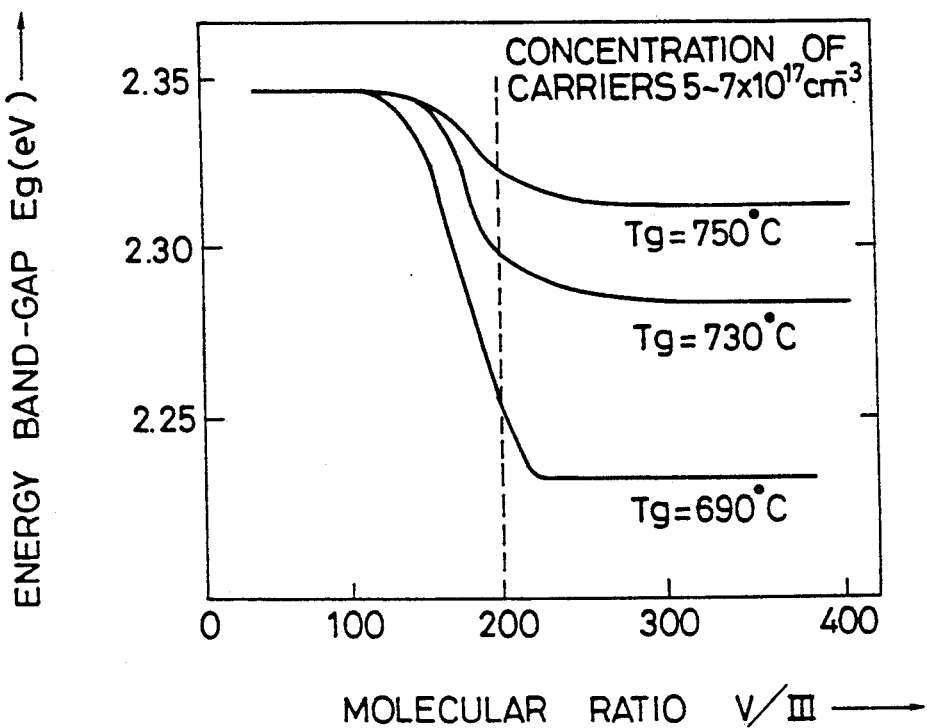
FIG. 10 is a graphic view of the relation between the energy band-gap Eg of the p type cladding layer 60 and a molecular ratio V/III of $PH_3$ (V- family material) to a III-family material for three types of growing temperatures Tg in cases where the cladding layer 60 is grown on condition that the concentration of carriers (positive holes) is set in the range from $5 \times 10^{17}$ atoms/cm$^{-3}$ to $7 \times 10^{17}$ atoms/cm$^{-3}$.
Figure 11:
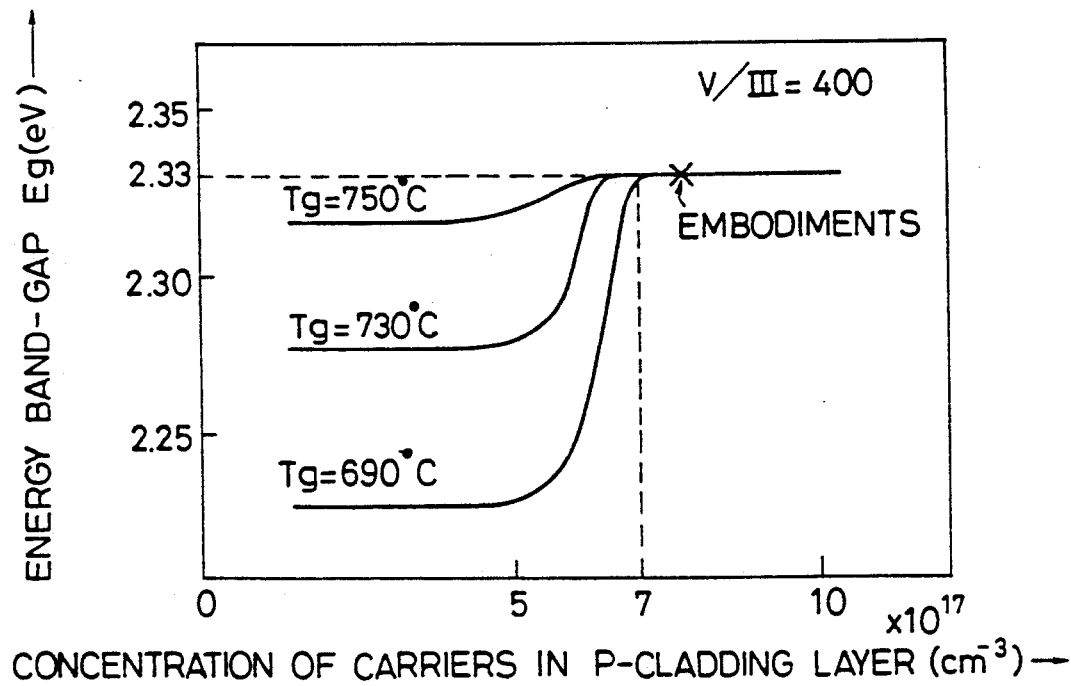
FIG. 11 is a graphic view of the relation between the energy band-gap Eg of the p type cladding layer 60 and the concentration of carriers (positive holes) for three types of growing temperatures Tg in cases where the cladding layer 60 is grown on condition that the ratio V/III of a $PH_3$ material to a III-family material is set to 400.

Experimental results indicating the relating between the energy band-gap of the p type cladding layer 60 and the growing condition are shown in FIGS. 10, 11.

FIG. 10 is a graphic view of the relation between the energy band-gap Eg of the p type cladding layer 60 and a molecular ratio V/III of PH$_3$ (V- family material) to a III-family material for three types of growing temperatures Tg in cases where the cladding layer 60 is grown on condition that the concentration of carriers (electrons) is set in the range from $5 \times 10^{17}$ atoms/cm$^{-3}$ to $7 \times 10^{17}$ atoms/cm$^{-3}$.

As shown in FIG. 10, the energy band-gap Eg of the cladding layer 60 is rapidly decreased at the three types of growing temperatures Tg such as 690° C., 730° C., and 750° C. when the molecular ratio V/III exceeds 200. The reason is because the natural superlattice structure oriented in the <111> direction is easily formed in the cladding layer 60 so that the region occupied by the natural superlattice structure is rapidly increased in the cladding layer 60.

Moreover, the value of the energy band-gap Eg is increased as the growing temperature Tg is raised up. The reason is because the natural superlattice structure oriented in the <111> direction is not easily formed in the cladding layer 60 as the growing temperature Tg is raised up.

FIG. 11 is a graphic view of the relation between the energy band-gap Eg of the p type cladding layer 60 and the concentration of carriers (positive holes) for three types of growing temperatures Tg in cases where the cladding layer 60 is grown on condition that the ratio V/III of a PH$_3$ material to a III-family material is set at 400.

As shown in FIG. 11, the energy band-gap Eg of the cladding layer 60 is rapidly decreased at the three types of growing temperatures Tg such as 690° C., 730° C., and 750° C. as the concentration of the carriers is increased in the range from $5 \times 10^{17}$ atoms/cm$^{-3}$ to $7 \times 10^{17}$ atoms/cm$^{-3}$.

Moreover, the energy band-gap Eg of the cladding layer 60 reaches the maximum value 2.33 eV at the concentration of the carriers more than $7 \times 10^{17}$ atoms/cm$^{-3}$.

In cases where the energy band-gap Eg of the cladding layer 60 is equal to or more than 2.33 eV, the natural superlattice structure is not formed in the cladding layer 60. However, the natural superlattice structure oriented in the 111> direction is formed in the cladding layer 60 in greater or less degree in cases where the energy band-gap Eg of the cladding layer 60 is less than 2.33 eV. The reason is because a p type dopant such as Zn strongly prevents the natural superlattice structure from being formed in the cladding layer 60 as the concentration of the carriers is increased.

The growing conditions of the cladding layer 60 are determined by utilizing the relations shown in FIGS. 10, 11. That is, the growing temperature is determined at a temperature 690° C. to form the cladding layer 60 with ease, the ratio V/III is determined at a value 400, and the concentration of the carriers is more than $8 \times 10^{17}$ atoms/cm$^{-3}$.

In the above growing conditions, the energy band-gap Eg of the cladding layer 60 is 2.33 eV so that the natural superlattice structure is not formed in the cladding layer 60. Therefore, the energy barrier between the active layer 59 and the cladding layer 60 is 620 meV because the energy band-gap of the active layer 59 of which the composition is $In_{0.02}Ga_{0.38}P$.

Other growing condition is next described with reference to FIG. 12.

Figure 12:
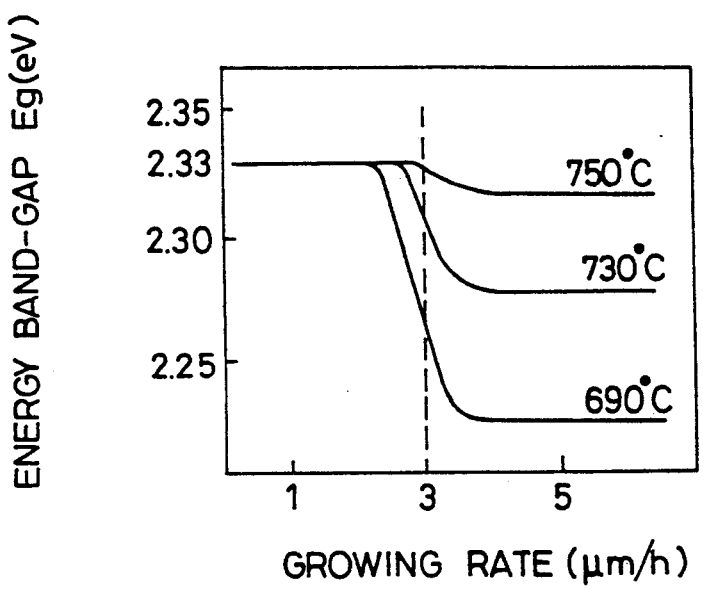
FIG. 12 is a graphic view of the relation between the energy band-gap Eg of the p type cladding layer 60 and a growing speed of the cladding layer 60 for three types of growing temperatures Tg in cases where the cladding layer 60 is grown on condition that the growing temperature Tg is 690° C., the ratio V/III is 400, and the concentration of the carriers is more than $8 \times 10^{17}$ atoms/cm$^{-3}$.

FIG. 12 is a graphic view of the relation between the energy band-gap Eg of the p type cladding layer 60 and a growing rate of the cladding layer 60 for three types of growing temperatures Tg in cases where the cladding layer 60 is grown on condition that the growing temperature Tg is 690° C., the ratio V/III is 400, and the concentration of the carriers is more than $8 \times 10^{17}$ atoms/cm$^{-3}$.

As shown in FIG. 12, the energy band-gap Eg of the p type cladding layer 60 is shifted depending on the growing rate. In detail, the energy band-gap Eg is increased as the growing rate is decreased in the range from 4 μm/h to 2 μm/h so that the energy band-gap Eg is the maximum value 2.33 eV at a specific growing rate equal to or less than 2 μm/h. In cases where the energy band-gap Eg of the cladding layer 60 is equal to or more than 2.33 eV, the natural superlattice structure is not formed in the cladding layer 60. However, the natural superlattice structure oriented in the <111> direction is formed in the cladding layer 60 in greater or less degree in cases where the energy band-gap Eg of the cladding layer 60 is less than 2.33 eV.

Therefore, the energy band-gap Eg of the p type cladding layer 60 can be shifted by the growing conditions such as the growing temperature Tg, the ratio V/III, the concentration of the carriers, and the growing rate.

As the experimental results, the relation between the electric current applied to the semiconductor laser device 51 and the intensity of the laser beam radiated from the cladding layer 59 is the same as the relation shown in FIG. 7. That is, the intensity 40 mW of the laser beam can be obtained up to the operating temperature 80° C.

Next, the shift of the life of the semiconductor laser device 51 is described with reference to FIG. 13.

Figure 13:
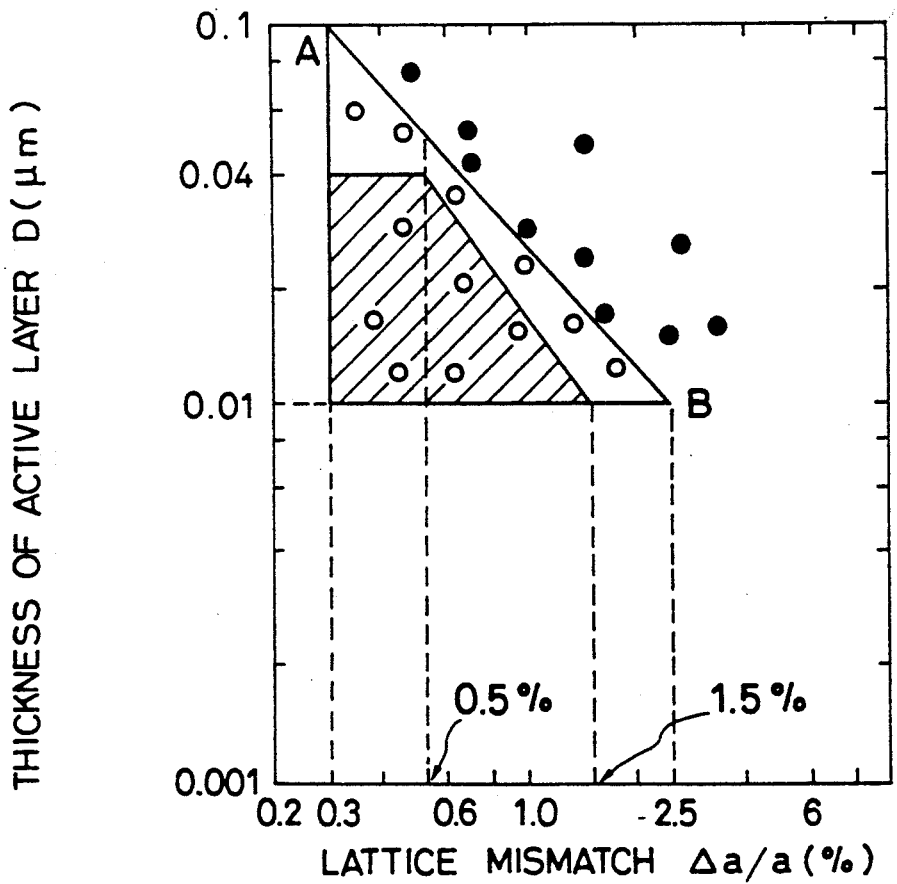
FIG. 13 is a graphic view of the relation between the lattice mismatch of the active layer 59 and the thickness of the active layer 59, showing the life of the semiconductor laser device 51 by white circles and black circles.

FIG. 13 is a graphic view of the relation between the lattice mismatch of the active layer 59 and the thickness of the active layer 59, showing the life of the semiconductor laser device 51 by white circles and black circles.

As shown in FIG. 13, the semiconductor laser devices 51 operated without trouble for over ten thousands hours are indicated by white circles, and, the semiconductor laser devices 51 in which the operation cannot be continued by trouble generated within one hundred hours are indicated by black circles. A group of the white circles is separated from a group of the black circles by a boundary line which connects an A point (0.3% lattice mismatch, 0.1 μm thickness) to a B point (2.5% lattice mismatch, 0.01 μm thickness).

The reason why the life of the semiconductor laser devices 51 considerably depends on the relation between the lattice mismatch Δa/a and the thickness D of the active layer 59 is because misfit dislocations are generated in the active layer 59 by the lattice mismatching condition so that the misfit dislocations are increased. Therefore, the upper limit of the lattice mismatch Δa/a is 0.3% in cases where the thickness of the active layer 59 is 0.1 μm. And, the upper limit of the lattice mismatch Δa/a is 2.5% in cases where the thickness of the active layer 59 is 0.01 μm.

In cases where the active layer 59 is thinned less than 0.01 μm, no laser beam is radiated from the active layer 59 because the amount of light confined in the active layer 59 is reduced. Therefore, the thickness D of the active layer 59 is required to be more than 0.01 μm.

Specifically, the operating current required in the semiconductor laser devices 51 is lowered in a region surrounded by four points (0.3% lattice mismatch, 0.01 μm thickness), (0.3% lattice mismatch, 0.04 μm thickness), (0.5% lattice mismatch, 0.04 μm thickness), and (1.5% lattice mismatch, 0.01 μm thickness) as shown by slanting lines in FIG. 13. Therefore, the semiconductor laser devices 51 can be further operated for a long time.

For reference, the conventional semiconductor laser device 301 shown in FIG. 1 is provided with the active layer 305 which is in the lattice matching condition with the substrate 302 and the p type cladding layer 306 grown on the active layer 305 in the growing conditions such as the growing temperature 750° C., the V/III ratio 300, and the concentration of the carriers $4 \times 10^{17}$ cm$^{-3}$. In this case, the energy band-gap of the active layer 305 is 1.88 eV, and the energy band-gap of the p type cladding layer 306 is 2.23 eV because the natural superlattice structure oriented toward the <111> direction is formed. That is, the energy barrier is 350 meV. Therefore, an allowable temperature to continuously radiate the laser beam is 40° C. in the semiconductor laser device 301 as shown in FIG. 2 so that the allowable operating temperature is low and the device 301 has a short life in practice.

On the other hand, the energy band-gap of the active layer 59 is decreased in the range from 1.83 eV to 1.49 eV because of the lattice mismatching with the substrate 52, and the energy band-gap of the cladding layer 60 is increased to 2.33 eV because no natural superlattice structure is formed because of the adjustment of the growing conditions. Therefore, the energy gap between the active layer 59 and the cladding layer 60 is increased in the range from 500 meV and 840 meV, so that the electrons in the active layer 59 are effectively prevented from being leaked to the cladding layer 60.

Accordingly, the InGaAlP type of semiconductor laser device with superior temperature characteristics can be obtained.

Specifically, as the results of the experiments, the allowable temperature to continuously radiate the laser beam is increased to more than 50° C. in the semiconductor laser device 51. Moreover, the semiconductor laser device 51 which is operated at the intensity 50 mW of the laser beam and in the range up to 100° C. in the operating temperature can be manufactured at a high yield rate in cases where the thickness D of the active layer 59 is in the range of 0.02±0.008 μm and the lattice constant of the active layer 59 is larger than that of the substrate 52 by the range from 0.5% to 2%.

The natural superlattice structure is not formed only in the p type cladding layer 60 in the first embodiment of the second modification. However, it is preferable that the natural superlattice structure be not formed in the p type cladding layers 60, 61, 62. Moreover, it is preferable that the natural superlattice structure be not formed only in a part of the p type cladding layer 60 adjacent to the active layer 59.

Moreover, the double-heterostructure section 54 is formed by the InGaAlP type of semiconductor material. However, any type of material can be utilized by adjusting the growing conditions on condition that the natural superlattice structure is naturally formed in the material. For example, an InGaAsP type of semiconductor material has been known in which the energy band-gap of the material is shifted by adjusting the ratio of the natural superlattice structure. Therefore, the second modification of the present invention is available for the InGaAsP type of semiconductor material and a GaAsP type of semiconductor material.

Moreover, the impurity Zn is doped in the semiconductor device to make the p type layers. However, it is preferable that impurity Mg be doped to make the p type layers.

Figure 14:
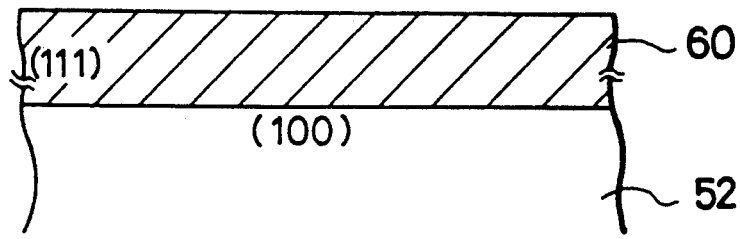
FIG. 14 shows the substrate cut to orient along the (100) plane direction in the semiconductor laser device shown in FIG. 9.

Moreover, the crystal forming the substrate 52 is cut to orient along the (100) plane direction as shown in FIG. 14. However, it is preferable that the crystal is cut to orient along a plane direction leaned within 15° from the (100) plane direction.

Next, a semiconductor device according to a second embodiment of the second modification of the present invention is described with reference to FIG. 15.

Figure 15:
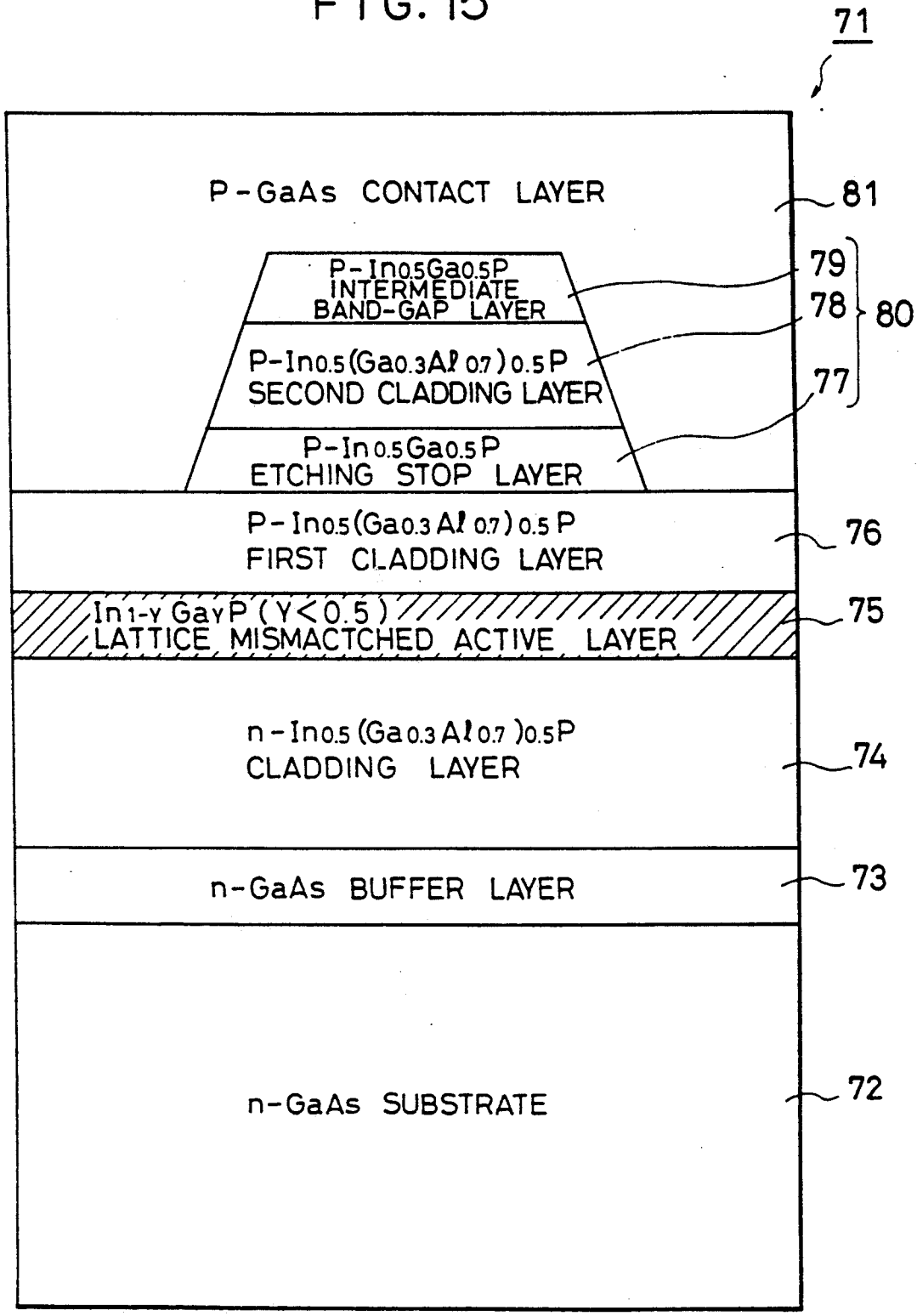
FIG. 15 is a schematic cross sectional view of a semiconductor device according to a second embodiment of the second modification, showing a ridge waveguide type of $In_{1-y}(Ga_{1-x}Al_x)_yP$ semiconductor laser device in which the lateral mode of the laser beam is controlled.

FIG. 15 is a schematic cross sectional view of a semiconductor device according to a second embodiment of the second modification, showing a ridge waveguide type of $In_{1-y}(Ga_{1-x}Al_x)_yP$ semiconductor laser device in which the lateral mode of the laser beam is controlled.

As shown in FIG. 15, a ridge waveguide type of $In_{1-y}(Ga_{1-x}Al_x)_yP$ semiconductor laser device 71 comprises:

a substrate 72 formed by an n type GaAs crystal of which the crystal is cut to orient along a (100) plane direction;

a buffer layer 73 formed by an n type GaAs crystal and mounted on the substrate 72;

an n type cladding layer cladding layer 74 formed by an n type $In_{0.5}(Ga_{0.3}Al_{0.7})_{0.5}P$ crystal and mounted on the buffer layer 73, the natural superlattice structure oriented in the <111> direction being formed in the layer 74;

a lattice mismatched active layer 75 formed by a $In_{1-y}Ga_yP$ (Y>0.5) crystal and mounted on the cladding layer 74;

a p type first cladding layer 76 formed by a p type $In_{0.5}(Ga_{0.3}Al_{0.7})_{0.5}P$ crystal and mounted on the active layer 75, no natural superlattice structure being formed in the layer 76;

a p type etching stop layer 77 formed by a p type $In_{0.5}Ga_{0.5}P$ crystal and mounted on the cladding layer 76;

a p type second cladding layer 78 formed by a p type $In_{0.5}(Ga_{0.3}Al_{0.7})_{0.5}P$ crystal and mounted on the etching stop layer 77;

an intermediate band-gap layer 79 formed by a p type $In_{0.5}Ga_{0.5}P$ crystal and mounted on the cladding layer 78, a ridge section 80 being shaped by the etching stop layer 77, the cladding layer 78, and the band-gap layer 79;

a contact layer 81 formed by a p type GaAs crystal and mounted on both the first cladding layer 76 and the intermediate band-gap layer 79 to surround the ridge section 80.

Moreover, impurity Zn is doped in the semiconductor device to make the p type layers 76 to 79, and 81 by the concentration of $1 \times 10^{18}$ atoms/cm$^{-3}$. Moreover, impurity Si is doped in the semiconductor device to make the n type layer 73 and the substrate 72 by the concentration of $1 \times 10^{17}$ atoms/cm$^{-3}$.

The substrate 72, the layers 73 to 79, and 81 are successively grown by an epitaxy growth technique such as a reduced-pressure MOCVD method.

The composition $In_{1-y}Ga_yP$ of the active layer 75 is obtained by setting Al ratio at X=0 in the $In_{1-y}(Ga_{1-x}Al_x)_yP$ expression.

In the above structure of the semiconductor laser device 71, carriers such as electrons and positive holes are injected in the device 71. In this case, the injected electrons are concentrated in the ridge shaped section 80 by a p—p hetero-barrier formed by both the first cladding layer 76 and the contact layer 81. Therefore, luminescence is implemented by recombination of an electron and a positive hole in the active layer 76 right below the ridge shaped section 80. At this time, lights generated by the luminescence are efficiently confined in the active layer 75 because of the difference in the refractive index between the active layer 75 and the outside of the active layer 75. Therefore, the intensity of the lights is efficiently raised up because the energy barrier between the active layer 75 and the first cladding layer 76 is increased by the lattice mismatch in the native layer 75 and no formation of the natural superlattice structure in the first cladding layer 76. Thereafter, the lights are emitted from the active layer 75 in a high intensity because the electrons cannot leak to the cladding layer 76 because of the increased large energy barrier regardless of whether or not the operating temperature is high.

Accordingly, the InGaAlP type of semiconductor laser device 71 with superior temperature characteristics can be obtained in the same manner as in the first embodiment.

A Ga/Al ratio in the n type cladding layer 74 and the p type cladding layers 76, 78 is not limited to 0.3/0.7. That is, the Ga/Al ratio can be suitably determined on condition that the energy band-gap of the cladding layers 74, 76, and 78 is larger than that of the active layer 75. For example, $0.3 \leq X < 1.0$ is available in an $In_{1-y}(Ga_{1-y}(Ga_{1-x}Al_x)_yP$ type of material.

It is preferable that the natural superlattice structure be not formed in the p type second cladding layer 78. Moreover, it is preferable that the natural superlattice structure be not formed only in a part of the p type cladding layer 76 adjacent to the active layer 75.

A semiconductor laser device comprising a substrate formed by an n type InGaP crystal in place of the substrate 72, a lattice mismatched active layer of the active layer 75, an etching stop layer formed by a GaAlAs or GaAs crystal in place of the etching stop layer 77, and an intermediate band-gap layer formed by GaAlAs or GaAs in place of the intermediate band-gap layer 79 has superior temperature characteristics in the same manner.

Next, a semiconductor device according to a third embodiment of the second modification of the present invention is described with reference to FIG. 16.

Figure 16:
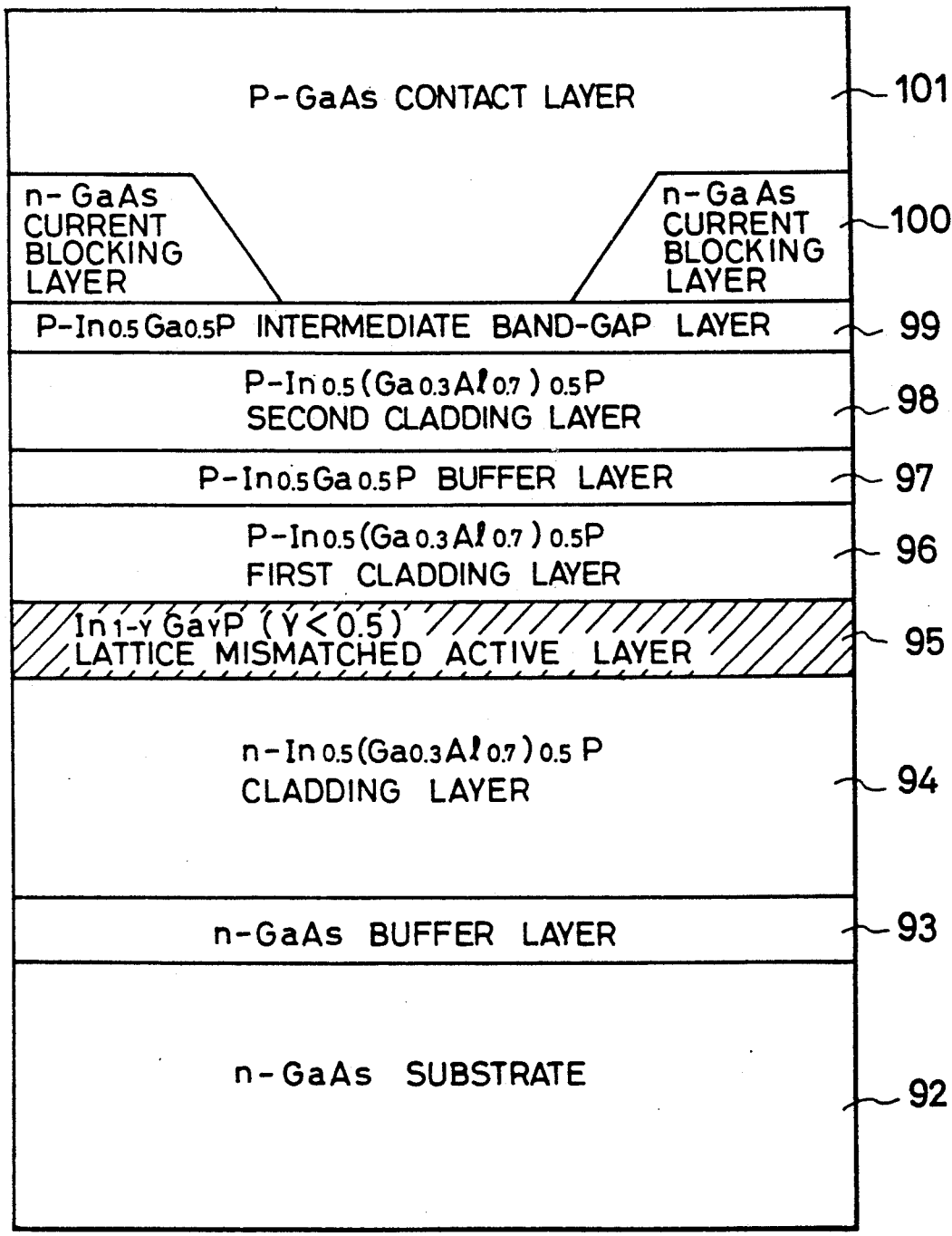
FIG. 16 is a schematic cross sectional view of a semiconductor device according to a third embodiment of the second modification, showing a ridge waveguide type of $In_{1-y}(Ga_{1-x}Al_x)_yP$ semiconductor laser device in which the lateral mode of the laser beam is controlled.

FIG. 16 is a schematic cross sectional view of a semiconductor device according to a third embodiment of the second modification, showing a ridge waveguide type of $In_{1-y}(Ga_{1-x}Al_x)_yP$ semiconductor laser device in which the lateral mode of the laser beam is controlled.

As shown in FIG. 16, a ridge waveguide type of $In_{1-y}(Ga_{1-x}Al_x)_yP$ semiconductor laser device 91 comprises:

a substrate 92 formed by an n type GaAs crystal of which the crystal is cut to orient along a (100) plane direction;

a buffer layer 93 formed by an n type GaAs or InGaP crystal and mounted on the substrate 92;

an n type cladding layer 94 formed by an n type $In_{0.5}(Ga_{0.3}Al_{0.7})_{0.5}P$ crystal and mounted on the buffer layer 93, the natural superlattice structure oriented in the <111> direction being formed in the layer 94;

a lattice mismatched active layer 95 formed by a $In_{1-y}Ga_yP$ (Y<0.5) crystal and mounted on the cladding layer 94;

a p type first cladding layer 96 formed by a p type $In_{0.5}(Ga_{0.3}Al_{0.7})_{0.5}P$ crystal and mounted on the active layer 95, no natural superlattice structure being formed in the layer 96;

a p type buffer layer 97 formed by a p type $In_{0.5}Ga_{0.5}P$ crystal and mounted on the cladding layer 96;

a p type second cladding layer 98 formed by a p type $In_{0.5}(Ga_{0.3}Al_{0.7})_{0.5}P$ crystal and mounted on the etching stop layer 97.

An intermediate band-gap layer 99 formed by a type $In_{0.5}Ga_{0.5}P$ (or AlGaAs type of) crystal and mounted on the cladding layer 98;

a pair of current blocking layers 100 formed by an n type GaAs (or semi-insulator GaAs or n type GaAlAs) and mounted on the intermediate band-gap layer 99; and a contact layer 101 formed by a p type GaAs crystal and mounted on the intermediate band-gap layer 99 and the current blocking layer 100.

Moreover, impurity Zn is doped in the semiconductor device to make the p type layers 96 to 99, and 101 by the concentration of $1 \times 10^{18}$ atoms/cm$^{-3}$. Moreover, impurity Si is doped in the semiconductor device to make the n type layers 93, 94 and the substrate 92 by the concentration of $1 \times 10^{17}$ atoms/cm$^{-3}$.

The substrate 92 and the layers 93 to 101 are successively grown by an epitaxy growth technique such as a reduced-pressure MOCVD method.

The composition $In_{1-y}Ga_yP$ of the active layer 95 is obtained by setting Al ratio at X=0 in the $In_{1-y}(Ga_{1-x}Al_x)_yP$ expression.

In the above structure of the semiconductor laser device 91, carriers such as electrons and positive holes are injected in the device 91. In this case, the injected electrons are concentrated in the center of a stripe positioned between the current blocking layers 100 by a p-n inverted junction formed between the the current blocking layer 100 and the contact layer 101. Therefore, luminescence is implemented by recombination of an electron and a positive hole in the active layer 96 right below the center of the stripe. At this time, lights generated by the luminescence are efficiently confined in the active layer 95 because of the difference in the refractive index between the active layer 95 and the outside of the active layer 95. Therefore, the intensity of the lights is efficiently raised up because the energy barrier between the active layer 95 and the first cladding layer 96 is increased by the lattice mismatch in the active layer 95 and no formation of the natural superlattice structure in the first cladding layer 96. Thereafter, the lights are emitted from the active layer 95 in a high intensity because the electrons cannot leak to the cladding layer 96 by the increased energy barrier regardless of whether or not the operating temperature is high.

Accordingly, the InGaAlP type of semiconductor laser device 91 with superior temperature characteristics can be obtained in the same manner as in the first embodiment.

A Ga/Al ratio in the n type cladding layer 94 and the p type cladding layers 96, 98 is not limited to 0.3/0.7. That is, the Ga/Al ratio can be suitably determined on condition that the energy band-gap of the cladding layers 94, 96, and 98 is large than that of the active layer 95. For example, $0.3 \leq X \leq 1.0$ is available in an $In_{1-y}(Ga_{1-x}Al_x)_yP$ type of material.

It is preferable that the natural superlattice structure be not formed in the p type second cladding layer 98. Moreover, it is preferable that the natural superlattice structure be not formed only in a part of the p type cladding layer 96 adjacent to the active layer 95.

Next, a semiconductor device according to a fourth embodiment of the second modification of the present invention is described with reference to FIG. 17.

Figure 17:
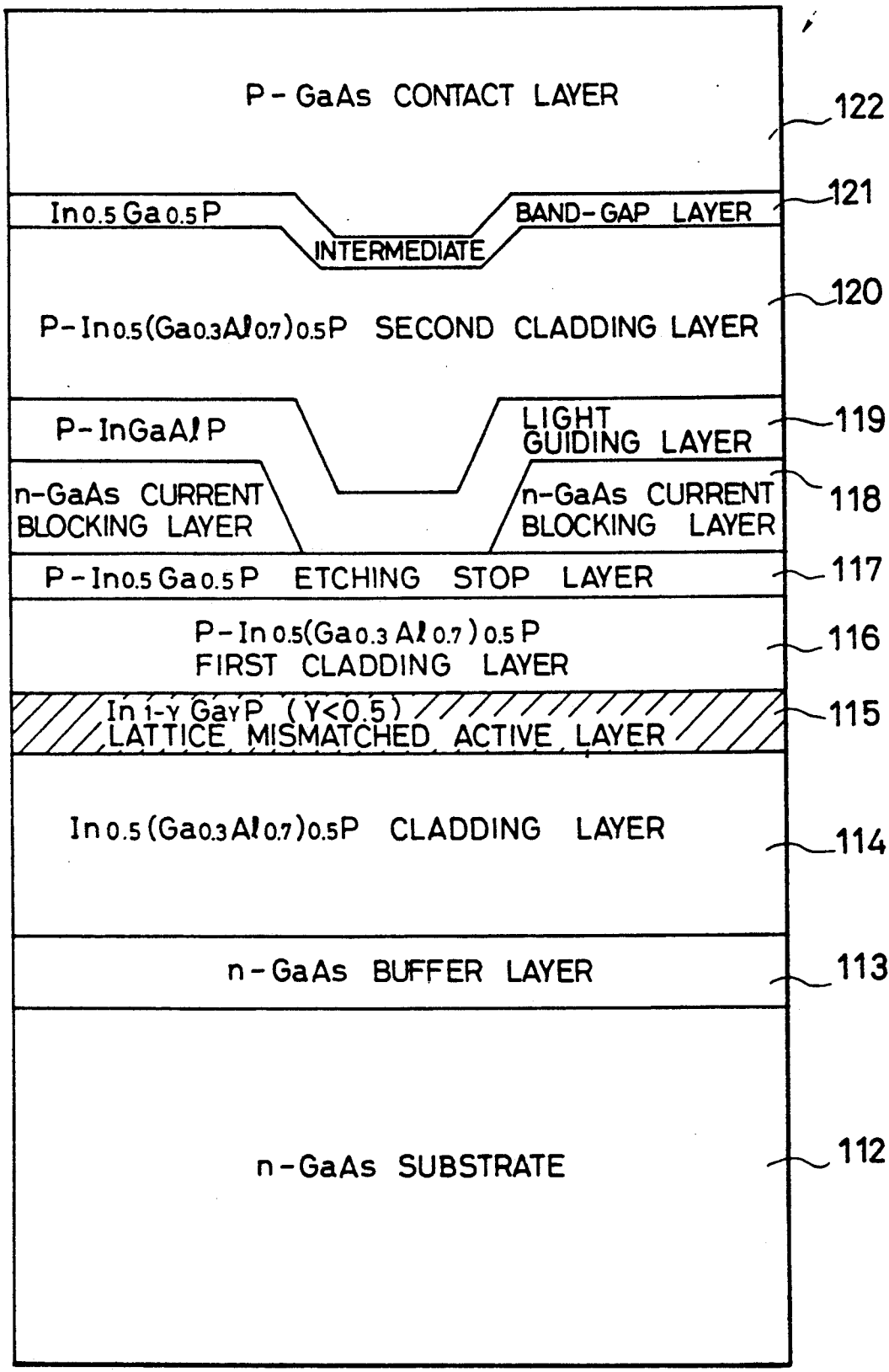
FIG. 17 is a schematic cross sectional view of a semiconductor device according to a fourth embodiment of the second modification, showing no ridge waveguide type of $In_{1-y}(Ga_{1-x}Al_x)_yP$ semiconductor laser device.

FIG. 17 is a schematic cross sectional view of a semiconductor device according to a fourth embodiment of the second modification, showing no ridge waveguide type of $In_{1-y}(Ga_{1-x}Al_x)_yP$ semiconductor laser device.

As shown in FIG. 17, and $In_{1-y}(Ga_{1-x}Al_x)_yP$ semiconductor laser device 111 comprises:

a substrate 112 formed by an n type GaAs crystal of which the crystal is cut to orient along a (100) plane direction;

a buffer layer 113 formed by an n type GaAs or InGaP crystal and mounted on the substrate 112;

an n type cladding layer 114 formed by an n type $In_{0.5}(Ga_{0.3}Al_{0.7})_{0.5}P$ crystal and mounted on the buffer layer 113, the natural superlattice structure oriented in the <111> direction being formed in the layer 114;

a lattice mismatched active layer 115 formed by a $In_{1-y}Ga_yP$ (Y<0.5) crystal and mounted on the cladding layer 114;

a p type first cladding layer 116 formed by a p type $In_{0.5}(Ga_{0.3}Al_{0.7})_{0.5}P$ crystal and mounted on the active layer 115, no natural superlattice structure being formed in the layer 116;

an etching stop layer 117 formed by $In_{0.5}Ga_{0.5}P$ (or GaAlAs type of) crystal and mounted on the cladding layer 116;

a pair of current blocking layers 118 formed by an n type GaAs (or semi-insulator InGaAs or n type GaAlAs) and mounted on the etching stop layer 117;

a light guiding layer 119 formed by a p type InGaAlP (or AlGaAs) type of crystal and mounted on the cladding layers 118 and the etching stop layer 117;

a p type second cladding layer 120 formed by a p type $In_{0.5}(Ga_{0.3}Al_{0.7})_{0.5}P$ crystal and mounted on the etching stop layer 119;

an intermediate band-gap layer 121 formed by a p type $In_{0.5}Ga_{0.5}P$ (or AlGaAs type of )crystal and mounted on the second cladding layer 120; and a contact layer 122 formed by a p type GaAs crystal and mounted on the intermediate band-gap layer 121.

A Ga/Al ratio in the n type cladding layer 114 and the p type cladding layers 116, 118 is not limited to 0.3/0.7. That is, the Ga/Al ratio can be suitably determined on condition that the energy band-gap of the cladding layers 114, 116, and 118 is larger than that of the active layer 115. For example, $0.3 \leq X < 1.0$ is available in an $In_{1-y}(Ga_{1-x}Al_x)_yP$ type of material.

An Al ratio in the light guiding layer 119 is smaller than that in the cladding layers 114, 116, and 118, and the Al ratio in the light guiding layer 119 is larger than that in the active layer 115. Moreover an Al ratio in the current blocking layer 118 is larger than that in the active layer 115.

Moreover, impurity Zn is doped in the semiconductor device to make the p type layers 116 to 117, and 119 to 122 by the concentration of $1 \times 10^{18}$ atoms/cm$^{-3}$. Moreover, impurity Si is doped in the semiconductor device to make the n type layers 113, 114 and the substrate 112 by the concentration of $1 \times 10^{17}$ atoms/cm$^{-3}$.

The substrate 112 and the layers 113 to 117 are successively grown by an epitaxy growth technique such as a reduced-pressure MOCVD method.

The composition $In_{1-y}Ga_yP$ of the active layer 115 is obtained by setting Al ratio at X=0 in the $In_{1-y}(GA_{1-x}Al_x)_yP$ expression.

In the above structure of the semiconductor laser device 111, carriers such as electrons and positive holes are injected in the device 111. In this case, the injected electrons are concentrated in the center of a stripe positioned between the current blocking layers 120 by a p-n inverted junction formed by the n type current blocking layer 118. Therefore, luminescence is implemented by recombination of an electron and a positive hole in the active layer 116 right below the center of the stripe. At this time, lights generated by the luminescence are efficiently confined in the active layer 115 because of the difference in the refractive index between the active layer 115 and the current blocking layer 118 or the light guiding layer 119. Therefore, the intensity of the lights is efficiently raised up because the energy barrier between the active layer 115 and the first cladding layer 116 is increased by the lattice mismatch in the active layer 115 and no formation of the natural superlattice structure in the first cladding layer 116. Thereafter, the lights are emitted from the active layer 115 in a high intensity because the electrons cannot leak to the cladding layer 116 by the increased energy barrier regardless of whether or not the operating temperature is high.

Accordingly, the InGaAlP type of semiconductor laser device 111 with superior temperature characteristics can be obtained in the same manner as in the first embodiment.

It is preferable that the natural superlattice structure be not formed in the p type second cladding layer 118 or the light guiding layer 119. Moreover, it is preferable that the natural superlattice structure be not formed only in a part of the p type cladding layer 116 adjacent to the active layer 115.

Next, a semiconductor device according to a fifth embodiment of the second modification of the present invention is described with reference to FIG. 18.

Figure 18:
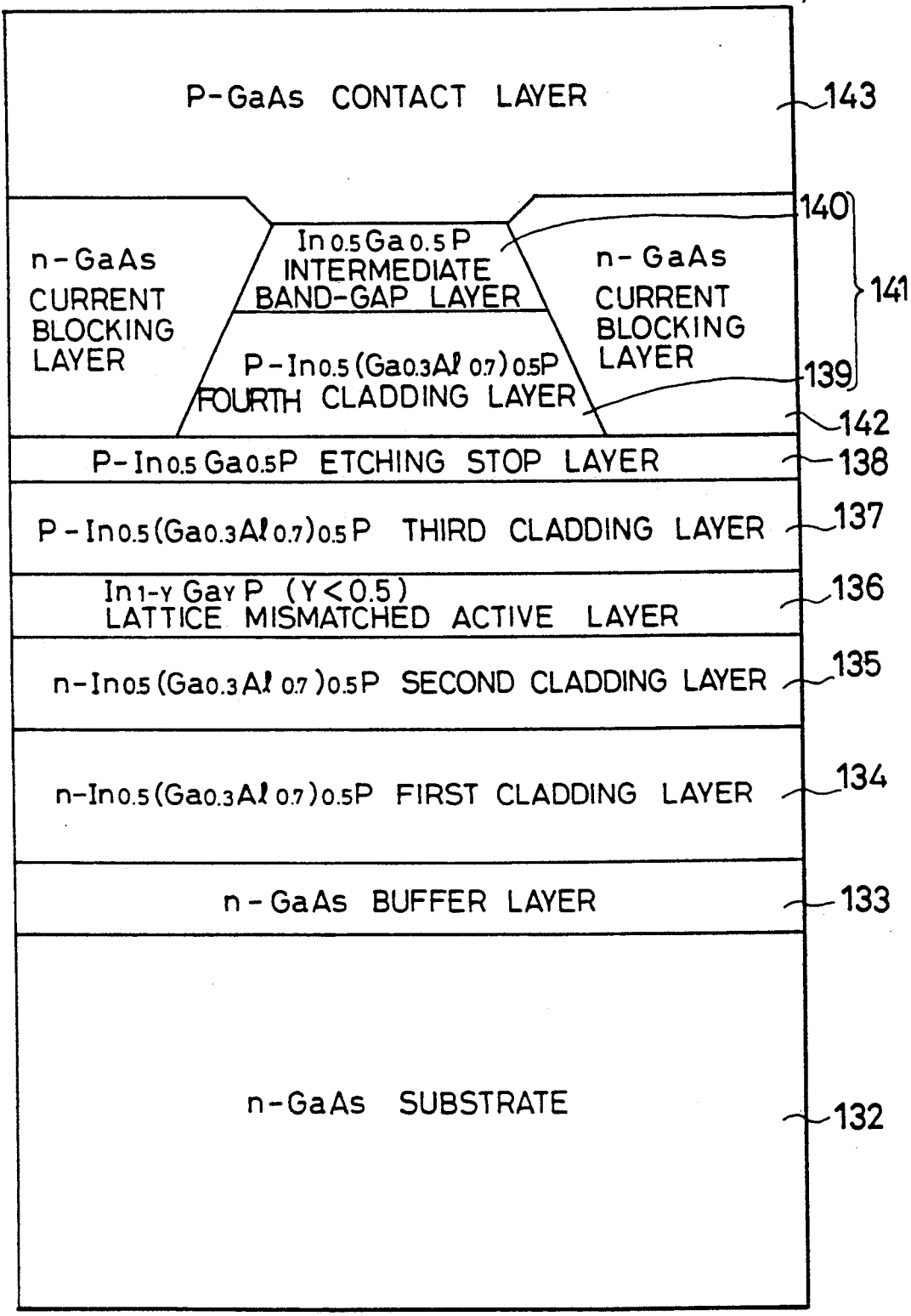
FIG. 18 is a schematic cross sectional view of a semiconductor device according to a fifth embodiment of the second modification, showing a ridge waveguide type of $In_{1-y}(Ga_{1-x}Al_x)_yP$ semiconductor laser device.

FIG. 18 is a schematic cross sectional view of a semiconductor device according to a fifth embodiment of the second modification, showing a ridge waveguide type of $In_{1-y}(Ga_{1-x}Al_x)_y P$ semiconductor laser device.

As shown in FIG. 18, an $In_{1-y}(Ga_{1-x}Al_x)_y P$ semiconductor laser device 131 comprises:

a substrate 132 formed by an n type GaAs crystal of which the crystal is cut to orient along a (100) plane direction;

a buffer layer 133 formed by an n type GaAs or InGaP crystal and mounted on the substrate 132;

an n type first cladding layer 134 formed by an n type $In_{0.5}(Ga_{0.3}Al_{0.7})_{0.5} P$ crystal and mounted on the buffer layer 133, the natural superlattice structure oriented in the <111> direction being formed in the layer 134;

an n type second cladding layer 135 formed by an n type $In_{0.5}(Ga_{0.4}Al_{0.6})_{0.5} P$ crystal and mounted on the first cladding layer 134, the natural superlattice structure oriented in the <111> direction being formed in the layer 135;

a lattice mismatched active layer 136 formed by a $In_{1-y}Ga_y P$ (Y<0.5) crystal and mounted on the second cladding layer 135;

a p type third cladding layer 1137 formed by a p type $In_{0.5}(Ga_{0.3}Al_{0.7})_{0.5} P$ crystal and mounted on the active layer 136, no natural superlattice structure being formed in the layer 137;

an etching stop layer 138 formed by $In_{0.5}Ga_{0.5}P$ (or GaAlAs type of) crystal and mounted on the third cladding layer 137;

a p type fourth cladding layer 139 formed by a p type $In_{0.5}(Ga_{0.3}Al_{0.7})_{0.5} P$ crystal and mounted on the etching stop layer 138, the fourth cladding layer 139 being positioned just above the center of the active layer 136;

an intermediate band-gap layer 140 formed by a p type $In_{0.5}Ga_{0.5}P$ (or GaAlAs type of) crystal and mounted on the fourth cladding layer 139, a ridge section 141 being shaped by both the fourth cladding layer 139 and the intermediate band-gap layer 140;

a pair of current blocking layers 142 formed by an n type GaAs or GaAlAs crystal and mounted on the etching stop layer 138, the current blocking layers 142 being adjacent to both sides of the ridge section 141; and a contact layer 143 formed by a p type GaAs crystal and mounted on the intermediate band-gap layer 140 and the current blocking layers 142.

An Al ratio in the cladding layers 134, 137, 139 is determined on condition that the energy band-gaps of the cladding layers 134, 137, 139 are larger than those of the cladding layer 135 and the active layer 136.

Moreover, an Al ratio in the second cladding layer 135 is larger than that in the active layer 136, and the Al ratio in the second cladding layer 135 is smaller than that in the fourth cladding layer 139.

Impurity Zn is doped in the semiconductor device to make the p type layers 137 to 140, and 143 by the concentration of $1 \times 10^{18}$ atoms/cm$^{-3}$. Moreover, impurity Si is doped in the semiconductor device to make the n type layers 133 to 135 and the substrate 132 by the concentration of $1 \times 10^{17}$ atoms/cm$^{-3}$.

The substrate 132 and layers 133 to 140 are successively grown by an epitaxy growth technique such as a reduced-pressure MOCVD method.

The composition $In_{1-y}Ga_y P$ of the active layer 115 is obtained by setting Al ratio at X=0 in the $In_{1-y}(Ga_{1-x}Al_x)_y P$ expression.

In the above structure of the semiconductor laser device 131, carriers such as electrons and positive holes are injected in the device 131. In this case, the injected electrons are concentrated in the ridge section 141 by a p-n inverted junction formed by the n type current blocking layer 142. Therefore, luminescence is implemented by recombination of an electron and a positive hole in the active layer 136 right below the ridge section 141. At this time, lights generated by the luminescence are efficiently confined in the active layer 136 because of the difference in the refractive index between the active layer 136 and the outside of the active layer 136. Therefore, the intensity of the lights is efficiently raised up because the energy barrier between the active layer 136 and the third cladding layer 137 is increased by the lattice mismatch in the active layer 136 and no formation of the natural superlattice structure in the third cladding layer 137. Thereafter, the lights are emitted from the active layer 136 in a high intensity because the electrons cannot leak to the cladding layer 137 by the increased energy barrier regardless of whether or not the operating temperature is high.

Accordingly, the InGaAlP type of semiconductor laser device 111 with superior temperature characteristics can be obtained in the same manner as in the first embodiment.

It is preferable that the natural superlattice structure be not formed in the p type fourth cladding layer 139. Moreover, it is preferable that the natural superlattice structure be not formed only in a part of the p type third cladding layer 137 adjacent to the active layer 136.

The second modification of the present invention is not limited to the above mentioned first to fifth embodiments. That is, the superior temperature characteristics can be obtained in a semiconductor laser device with the double heterostructure formed by an InGaAlP or InGaAsP crystal. In addition, the superior temperature characteristics can be obtained in a semiconductor laser device with the double heterostructure formed by a binary mixed crystal of, for example, (InP)(GaP).

Moreover, the superior temperature characteristics can be obtained in a gain-guided type of semiconductor laser device, in a wide stripe type of semiconductor laser device, in a semiconductor laser device in which carriers are not injected to a laser-beam-emitting surface, and in a semiconductor laser device with a window positioned on a laser-beam-emitting surface in which concentrated lights are not absorbed.

Further, the superior temperature characteristics can be obtained in a light-emitting diode.

The material of the substrate 52, 72, 92, 112, or 132 is not limited to the GaAs type of material. That is, any material of which the lattice constant is almost the same as that of the GaAs crystal is available. For example, an AlAs type of material is available.

The second modification is not limited to the reduced-pressure MOCVD method. That is, a molecular beam epitaxy (MBE) method or a gas source MBE method is available.

The direction of a ridge stripe in the ridge sections 63, 80, 141 is not limited to the fixed direction. That is, the ridge stripe oriented in a <011> direction or in a <01$\bar{1}$> direction is available in cases where the corresponding substrate 52, 72, 92, 112, or 132 is oriented along the (100) plane direction. Here, the symbol $\bar{1}$ indicates a negative crystallographic axis direction in the Miller indices.

It is preferable that the crystal forming the substrate be cut to orient along a plane direction sloped from the (100) plane direction to a <011> or <01$\bar{1}$> direction within 15°.

Next, a third modification of the present invention is described.

FIG. 19 is a conceptual cross sectional view of a semiconductor laser device according to a third modification of the present invention, showing lattice mismatch in an active layer.

As conceptually shown in FIG. 19, a semiconductor laser device 151 comprises:

a GaAs substrate 152 of which the crystal is cut so as to orient along a specific plane direction leaning from a (100) plane direction by a prescribed angle toward a direction equivalent to a <011> direction, and a double-heterostructure section 153 mounted on the substrate 152 at an epitaxial junction.

Figure 20:
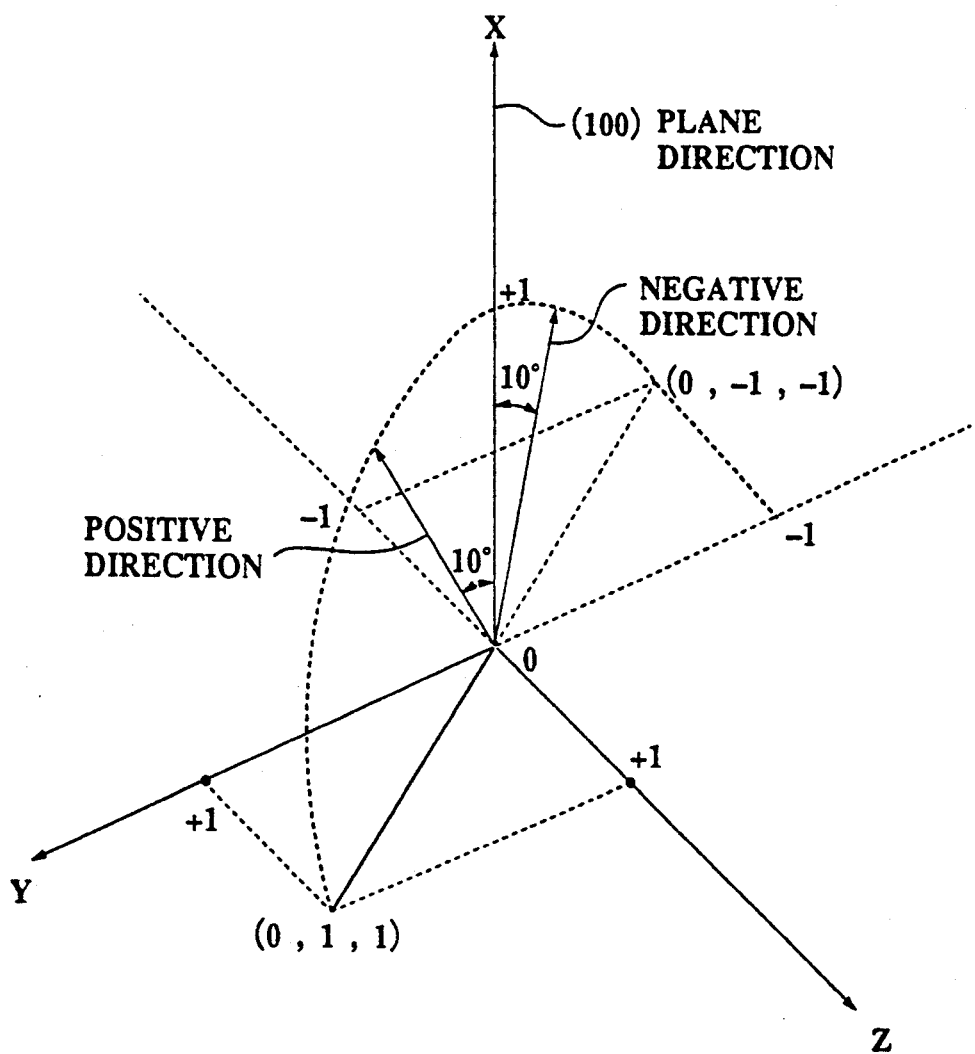
FIG. 20 is a graphic view showing a specific plane direction leaning by 10° toward a direction equivalent to a <011> direction from a (100) plane direction.

Here, as shown in FIG. 20, there are two types of directions equivalent to the <011> direction. One type of direction is called a positive direction in this specification. Also, another direction is called a negative direction in this specification. The positive direction leans by 10° toward the <011> direction from the (100) plane direction. On the other hand, the negative direction leans by 10° toward a <0 −1 −1> direction from the (100) plane direction.

Therefore, the specific plane direction agrees with the positive or negative direction.

The double-heterostructure section 153 comprises:

an In$_{1-y}$(Ga$_{1-x}$Al$_x$)$_y$P type of lattice mismatched active layer 154 for radiating a laser beam;

an In$_{1-y}$(Ga$_{1-x}$A;$_x$)$_y$P type of n type cladding layer 155 arranged on one side of the active layer 154 for confining injected carriers in the active layer 154; and an In$_{1-y}$(Ga$_{1-x}$Al$_x$)$_y$P type of p type cladding layer 156 arranged on another side of the active layer 154 for confining injected carriers in the active layer 154 by co-operating with the n type cladding layer 155.

The substrate 152, the active layer 154, and the cladding layers 155, 156 are successively grown by an epitaxy growth technique.

The lattice constant of the active layer 154 is 0.5% to 2.0% larger than that of the substrate 152. Therefore, the energy band-gap of the active layer 154 is decreased. As a result, the energy barrier between the active layer 154 and the cladding layer 155 or 156 is increased.

Therefore, electrons injected in the semiconductor laser device 151 are efficiently confined in the active layer 154 through the p type cladding layer 156, and positive holes injected in the semiconductor laser device 151 are efficiently confined in the active layer 154 through the n type cladding layer 155.

The feature generated by the crystal cut so as to orient along the specific plane direction leaning from the (100) plane direction by the prescribed angle to the direction equivalent to the <011> direction is described.

In general, in cases where a double-heterostructure section is successively grown by the epitaxy growth technique on a conventional GaAs substrate which is cut so as to orient along the (100) plane direction, the energy band-gap of the lattice mismatched active layer 14, or 44 is decreased as compared with the conventional active layer 305 shown in FIG. 1. Therefore, the wavelength of the laser beam radiated form the lattice mismatched active layer 14, or 44 is lengthened. For example, in cases where the lattice mismatch of the active layer is 1.0%, the wavelength of the laser beam is lengthened by 20 nm so that the wavelength becomes 690 nm.

According to the third modification, because the substrate 152 is cut so as to orient along the specific plane direction leaning from the (100) plane direction by a prescribed angle toward the direction equivalent to the <011> direction, the growing direction of the crystals forming double-heterostructure section 153 is shifted. Therefore, the energy band-gaps of the active layer 154 and the cladding layers 155, 156 are respectively increased. For example, in cases where the specific direction leans by 10° from the (100) plane direction, the wavelength of the laser beam radiated from the lattice mismatched active layer 154 is shortened by about 20 nm. That is, the wavelength of the laser beam becomes 670 nm.

Accordingly, the drawback of the lengthened wavelength generated by the lattice mismatch of the active layer 154 can be compensated by the substrate 152 cut along the specific plane direction. In addition, the increased energy barrier between the active layer 154 and the cladding layer 155 or 156 can be maintained.

Next, the energy band-gap influenced by shifting the specific plane direction leaning from the (100) plane direction in the substrate 152 is quantitatively described.

FIG. 21 is a graphic view showing the characteristic shift of the energy band-gaps in the active layer 154 and the cladding layers 155, 156 in cases where the specific plane direction leaning from the (100) plane direction is shifted in the range from 0° to over 20°.

In FIG. 21, an X-axis indicates the angle $\theta$ leaning from the (100) plane direction in the substrate 152. A left Y-axis indicates the shifted values of the energy band-gaps in the active layer 154 and the cladding layers 155, 156. A right Y-axis indicates the shifted wavelength value of the laser beam radiated from the active layer 154. The shifted wavelength value corresponds to the shifted value of the energy band-gap in the active layer 154.

The shifted values of the energy band-gap in the active layer 154 and the cladding layers 155, 156 are measured by utilizing a photoluminescence wavelength analysis on condition that the layers are formed at the growing temperature 700° C. and the V/III ratio 300. The shifted values of the energy band-gaps are calculated by comparing the energy band-gaps in the active layer 154 and the cladding layers 155, 156 with those in a reference active layer and the cladding layer 46 in which the natural superlattice structure is not formed as shown in FIG. 8. That is, the shifted value of the energy band-gap in the active layer 154 is calculated by subtracting the energy band-gap measured in the active layer 154 from the energy band-gap in the reference active layer with no natural superlattice structure of which the lattice constant matches with the substrate 152. In the same manner, the shifted value of the energy band-gap in the cladding layer 155 (156) is calculated by subtracting the energy band-gap measured in the cladding layer 155 (156) from the reference energy band-gap in the cladding layer 46 with no natural superlattice structure.

As shown in FIG. 21, the energy band-gaps in the active layer 154 and the cladding layers 155, 156 are respectively increased as the angle $\theta$ leaning from the (100) plane direction in the substrate 152 is increased. The increased rate in the active layer 154 is almost the same as those in the cladding layers 155, 156. In addition, the increased energy band-gaps in the active layer 154 and the cladding layers 155, 156 are saturated when the angle $\theta$ is about 15°.

Therefore, the wavelength of the laser beam radiated from the active layer 154 is, for example, shortened by about 20 nm when the substrate 152 is cut to orient along the specific plane direction leaning by 10° from the (100) plane direction.

In addition, the energy barrier between the active layer 154 and the cladding layer 155 (156) is maintained at the same value for any angle $\theta$ because the increased rate in the active layer 154 is almost the same as those in the cladding layers 155, 156. Therefore, the improvement of the temperature characteristics described in the first and second modifications is maintained.

As for the relation between the thickness D of the active layer 154 and the lattice mismatch of the active layer 154, the condition required to the active layer 154 is the same as that in the first modification. That is, the equation (1) must be satisfied. In addition, the upper limit of the thickness D is 0.1 $\mu$m and the lower limit of the thickness D is 0.01 $\mu$m.

Next, a ridge waveguide type of $In_{1-y}(Ga_{1-x}Al_x)_yP$ semiconductor laser device in which the lattice mismatch of the active layer is set at +1.0% is described with reference to FIG. 22.

Figure 22:
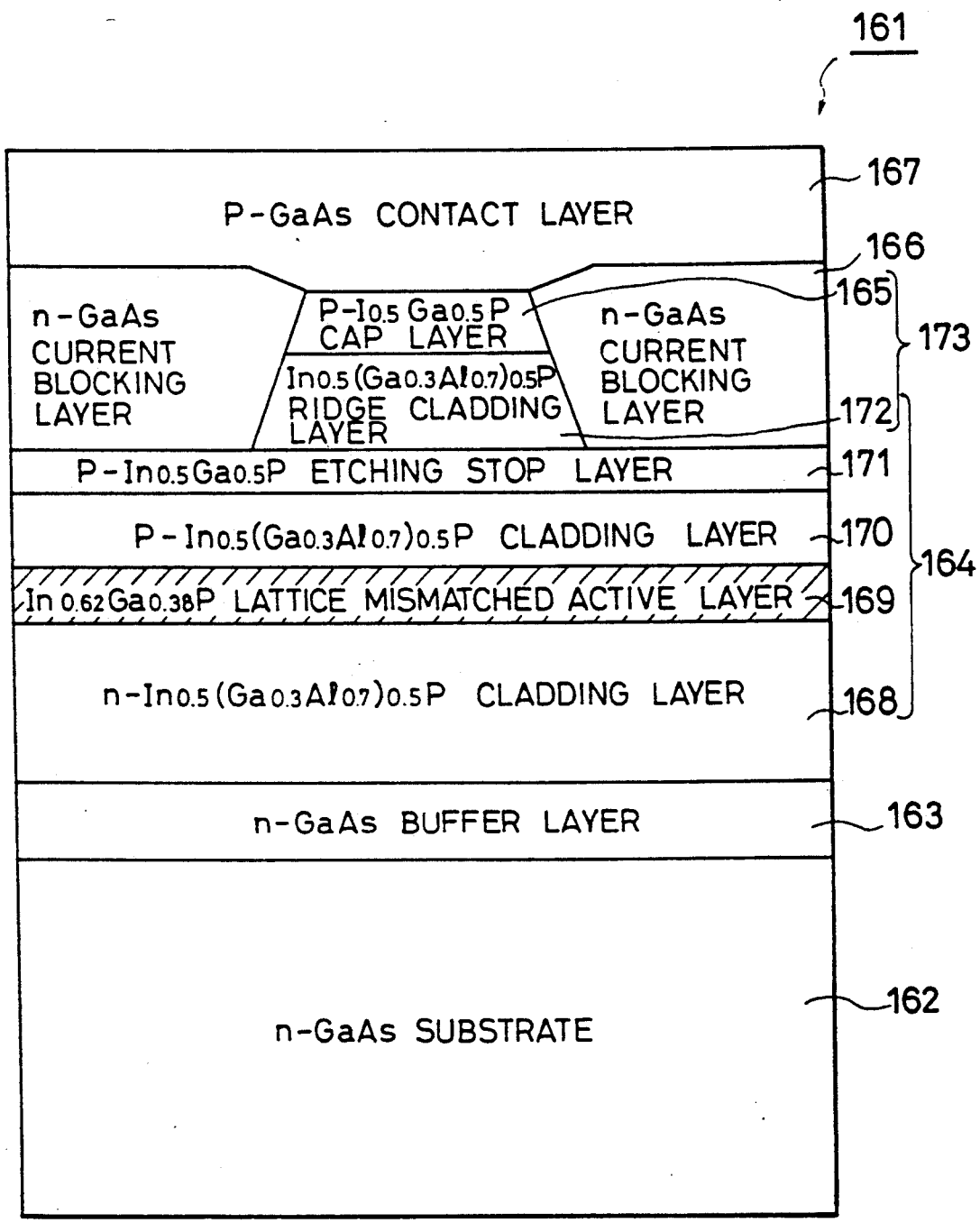
FIG. 22 is a schematic cross sectional view of a $In_{1-y}(Ga_{1-x}Al_x)_yP$ type of semiconductor laser device according to a first embodiment of the third modification.

FIG. 22 is a schematic cross sectional view of a $In_{1-y}(Ga_{1-x}Al_x)_yP$ semiconductor laser device according to a first embodiment of the third modification.

As shown in FIG. 22, a ridge waveguide type of $In_{1-y}(Ga_{1-x}Al_x)_yP$ semiconductor laser device according to a first embodiment of the third modification.

As shown in FIG. 22, a ridge waveguide type of $In_{1-y}(Ga_{1-x}Al_x)_yP$ semiconductor laser device 161 comprises:

a substrate 162 formed by an n type GaAs crystal of which the crystal is cut to orient along a specific plane direction leaning from a (100) plane direction by an angle of 10° toward a direction equivalent to a <011> direction;

a buffer layer 163 formed by an n type GaAs crystal and mounted on the substrate 162;

a double-heterostructure section 164 mounted on the buffer layer 163;

a cap layer 165 formed by a p type $In_{0.5}Ga_{0.5}P$ crystal and mounted on the section 164;

a pair of current blocking layers 166 formed by an n type GaAs crystal and mounted on the section 164; and a contact layer 167 formed by a p type GaAs crystal and mounted on both the cap layer 165 and the current blocking layer 166.

The double-heterostructure section 164 comprises:

an n type cladding layer 168 formed by an n type $In_{0.5}(Ga_{0.3}Al_{0.7})_{0.5}P$ crystal and mounted on the buffer layer 163;

a lattice mismatched active layer 169 formed by a $In_{0.62}Ga_{0.38}P$ crystal and mounted on the cladding layer 168;

a p type cladding layer 170 formed by a p type $In_{0.5}(Ga_{0.3}Al_{0.7})_{0.5}P$ crystal and mounted on the active layer 169;

a p type etching stop layer 171 formed by a p type $In_{0.5}Ga_{0.5}P$ crystal and mounted on the cladding layer 170; and a ridge cladding layer 172 formed by a p type $In_{0.5}(Ga_{0.3}Al_{0.7})_{0.5}P$ crystal and mounted on the etching stop layer 171, a ridge section 173 being shaped by the cap layer 165 and the ridge cladding layer 172.

Impurity Zn is doped in the semiconductor device 161 to make the p type layers 165, 167, 170, 171, and 172 by the concentration of $1 \times 10^{18}$ atoms/cm$^{-3}$. Moreover, impurity Si is doped in the semiconductor device 161 to make the n type layer 163, 168, 166 and the substrate 162 by the concentration of $1 \times 10^{17}$ atoms/cm$^{-3}$.

The substrate 162, the buffer layer 163, and the double-heterostructure section 164 are successively grown by an epitaxy growth technique such as a reduced-pressure MOCVD method. The double-heterostructure section 164 is formed at the growing conditions such as the growing temperature 700° C. and the V/III ratio 300.

The composition $In_{0.62}Ga_{0.38}P$ of the active layer 169 is obtained by setting Al ratio at X=0 and setting Ga ratio at Y=0.38 in the $In_{1-y}(Ga_{1-x}Al_x)_yP$ expression. In addition, the composition $In_{0.5}(Ga_{0.3}Al_{0.7})_{0.5}P$ of the cladding layers 170, 172 is obtained by setting Al ratio at X=0.7 and Ga+Al ratio to Y=0.5 in the $In_{1-y}(Ga_{1-x}Al_x)_yP$ expression.

The lattice mismatch of the active layer 169 is confirmed by utilizing a photoluminescence wavelength anaylsis, and X-ray diffraction, or a transmission electron microscope. That is, the active layer 169 is 0.015 $\mu$m thick and the lattice constant of the active layer 169 is 1.0% larger than that of the substrate 162.

In the above structure of the ridge waveguide type of $In_{1-y}(Ga_{1-x}Al_x)_yP$ semiconductor laser device 161, carriers injected in the device 161 are confined in the center of the active layer 169 because the conductive type of the current blocking layer 169 is inverted against the ridge cladding layer 172. Therefore, luminescence is implemented by recombination of an electron and a positive hole in the active layer 169 right below the ridge section 173. At this time, lights generated by the luminescence are efficiently confined in the active layer 169 because of the difference in the refractive index between the active layer 169 and the outside of the active layer 169. Therefore, the intensity of the lights is efficiently raised up because the energy barrier between the active layer 169 and the cladding layer 170 is increased by the lattice mismatch in the active layer 169. Thereafter, a laser beam is emitted from the active layer 169 in a high intensity because the electrons cannot leak to the cladding layer 170 by the increased energy barrier regardless of whether or not the operating temperature is high.

In addition, as shown in FIG. 21, the wavelength of the laser beam is shortened by 20 nm because the substrate is cut to orient along a specific plane direction leaning from a (100) plane direction by an angle of 10°.

Accordingly, the high intensity of the laser beam can be radiated at a high temperature although the active layer 169 is thinned at 0.015 μm thick.

In addition, the laser beam with the shortened wavelength can be radiated from the semiconductor laser device 161 while the improvement of the temperature characteristics is maintained.

The above mentioned superior effects such as the high intensity of the laser beam at a high temperature in the semiconductor laser device 161 can be obtained in a semiconductor laser device comprising the substrate 162, an n type buffer layer formed by a InGaP type of crystal and mounted on the substrate 162, the cladding layers 168, 170, the active layer 169, the cladding layer 171 of which the thickness is from 0.1 μm (1000 Å) to 0.4 μm (4000 Å), a p type etching stop layer formed by a InGaAlP, GaAlAs, or GaAs type of crystal and mounted on the cladding layer 171, the cladding layer 173, a p type cap layer formed by an InGaAlP, GaAlAs, or GaAs type of crystal and mounted on the cladding layer 173, a current blocking layer formed by an n type or semi-insulator GaAs or n type- or semi-insulator GaAlAs type of crystal and mounted on the etching stop layer, and the contact layer 167.

Moreover, the superior effects can be obtained in a semiconductor laser device provided with a lattice mismatched active layer fabricated by a quantum well structure formed by both a quantum well layer and a barrier layer in place of the active layer 169 in the semiconductor laser device 161.

In the first embodiment of the third modification, the energy band-gap of the active layer 169 is shifted by shifting the lattice mismatch a/Δa of the active layer 169 to obtain the laser beam with high intensity. However, the means for shifting the energy band-gap of the active layer 169 is not limited to the shift of the lattice mismatch. That is, in cases where the active layer is formed by a $In_{1-y}(Ga_{1-x}Al_x)_yP$ type of material, the energy band-gap of the active layer can be shifted by shifting the composition X of Al. Moreover, the energy band-gap of the active layer can be shifted by changing the crystal growing conditions to shift the arrangement of the atoms.

In cases where the energy band-gap of a general active layer obtained by changing the crystal growing conditions is the same as that of the active layer 169, the kink level is prominently improved in a semiconductor laser device with the general active layer. In addition, the other device characteristics such as the decrease of the radiative threshold and a differential quantum efficiency is prominently improved in the same manner as in the first embodiment of the third modification.

The reason that the device characteristics such as the kink level is improved is described.

In general, the band structure of the active layer 169 is shifted by the local stress generated in a boundary region between the active layer 169 and the cladding layer 170 so that the effective mass of the positive hole moving along the surface direction of the active layer 169 is decreased.

Moreover, both the density of the injected carriers and the operating temperature generally influence on the energy difference between an edge of a band occupied by the positive holes of which the effective mass is light and an edge of another band occupied by the positive holes of which the effective mass is heavy. The energy difference must be large to improve the device characteristics. In cases where the lattice mismatch of the active layer 169 is equal to or more than 0.5%, the energy difference becomes large so that the device characteristics are improved. Especially, in cases where the lattice mismatch of the active layer 169 is equal to or more than 0.6%, the energy difference is sufficiently large so that the improvement of the device characteristics can be reliably achieved.

According to the first embodiment of the third modification, in cases where the composition ratio of Ga is set at $Y=0.38$ in the $In_{1-y}Ga_yP$ material, the lattice constant of the active layer 169 becomes 1.0% larger than that of the substrate 162, while the lattice constant of the active layer agrees with that of the substrate 162 in cases where the composition ratio of Ga is set at $Y=0.5$. Therefore, the effective mass of the positive hole existing in the valence band can be decreased when the positive holes are moved along the surface direction of the active layer 169.

Accordingly, the diffusion length of the positive hole can be enlarged along the surface direction of the active layer 169. Therefore, for example, the generation of the kink phenomenon resulting from the hole-burning phenomenon can be reduced. As a result, the lateral mode of the laser beam can be stable when the laser beam is radiated in a high intensity. That is, the semiconductor laser device 161 can be utilized as a laser source to store information in an optical disk in a high density.

Next, a semiconductor device according to a second embodiment of the third modification of the present invention is described with reference to FIG. 23.

Figure 23:
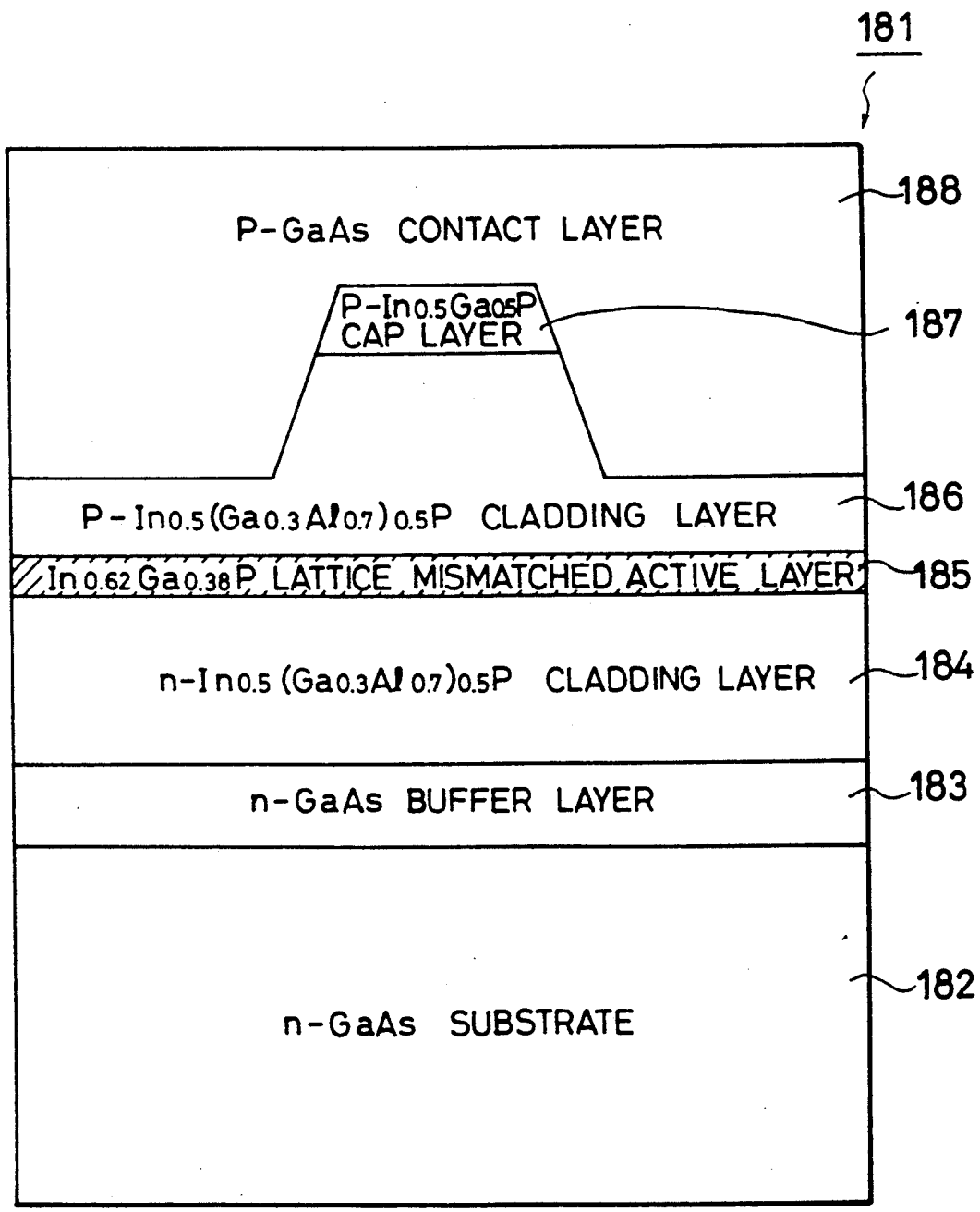
FIG. 23 is a schematic cross sectional view of a semiconductor device according to a second embodiment of the third modification, showing a ridge waveguide type of $In_{1-y}(Ga_{1-x}Al_x)_yP$ semiconductor laser device in which the lateral mode of the laser beam is controlled.

FIG. 23 is a schematic cross sectional view of a semiconductor device according to a second embodiment of the third modification, showing a ridge waveguide type of $In_{1-y}(Ga_{1-x}Al_x)_yP$ semiconductor laser device in which the lateral mode of the laser beam is controlled.

As shown in FIG. 23, a ridge waveguide type of $In_{1-y}(Ga_{1-x}Al_x)_yP$ semiconductor laser device 181 comprises:

a substrate 182 formed by an n type GaAs crystal of which the crystal is cut to orient along a specific plane direction leaning from a (100) plane direction by an angle of 10° toward a direction equivalent to a $\leq 011>$ direction;

a buffer layer 183 formed by an n type GaAs crystal and mounted on the substrate 182;

an n type cladding layer 184 formed by an n type $In_{0.5}(Ga_{0.3}Al_{0.7})_{0.5}P$ crystal and mounted on the buffer layer 183;

a lattice mismatched active layer 185 formed by a $In_{0.62}Ga_{0.38}P$ crystal and mounted on the cladding layer 184;

a p type cladding layer 186 formed by a p type $In_{0.5}(Ga_{0.3}Al_{0.7})_{0.5}P$ crystal and mounted on the active layer 185;

a p type cap layer 187 formed by an $In_{0.5}Ga_{0.5}P$ crystal and mounted on the cladding layer 186; and a contact layer 188 formed by a p type GaAs crystal and mounted on both the cap layer 187 and the cladding layer 186 to surround the cap layer 187.

The lattice constant of the lattice mismatched active layer 185 is 1.0% larger than that of the substrate 182 as shown in FIG. 4. In addition, the thickness D of the lattice mismatched active layer 185 is 0.015 μm.

Impurity Zn is doped in the semiconductor device 181 to make the p type layers 186 to 188 by the concentration of $1 \times 10^{18}$ atoms/cm$^{-3}$. Moreover, impurity Si is doped in the semiconductor device 181 to make the n type layer 183, 184 and the substrate 182 by the concentration of $1 \times 10^{17}$ atoms/cm$^{-3}$.

The substrate 812 and the layers 183 to 186 are successively grown by an epitaxy growth technique such as a reduced-pressure MOCVD method.

The composition $In_{0.62}Ga_{0.38}P$ of the active layer 185 is obtained by setting Al ratio at X=0 and setting Ga ratio at Y=0.38 in the $In_{1-y}(Ga_{1-x}Al_x)_yP$ expression.

In the above structure of the semiconductor laser device 181, the energy band-gaps in the cladding layers 184, 186 are increased because the layers are grown on the substrate 182 cut to orient along the specific plane direction. In addition, the energy band-gap decreased by the lattice mismatch in the active layer 185 is compensated because the layers are grown on the substrate 182 cut to orient along the specific plane direction.

Accordingly, the device characteristics are the same as those in the first embodiment of the third modification.

That is, the high intensity of the laser beam can be radiated at a high temperature although the active layer 196 is thinned.

In addition, the laser beam with the shortened wavelength can be radiated from the semiconductor laser device 181 while the improvement of the temperature characteristics is maintained.

Moreover, the semiconductor laser device 181 can be easily manufactured as compared with the semiconductor laser device 161.

Next, a semiconductor device according to a third embodiment of the third modification of the present invention is described with reference to FIG. 24.

Figure 24:
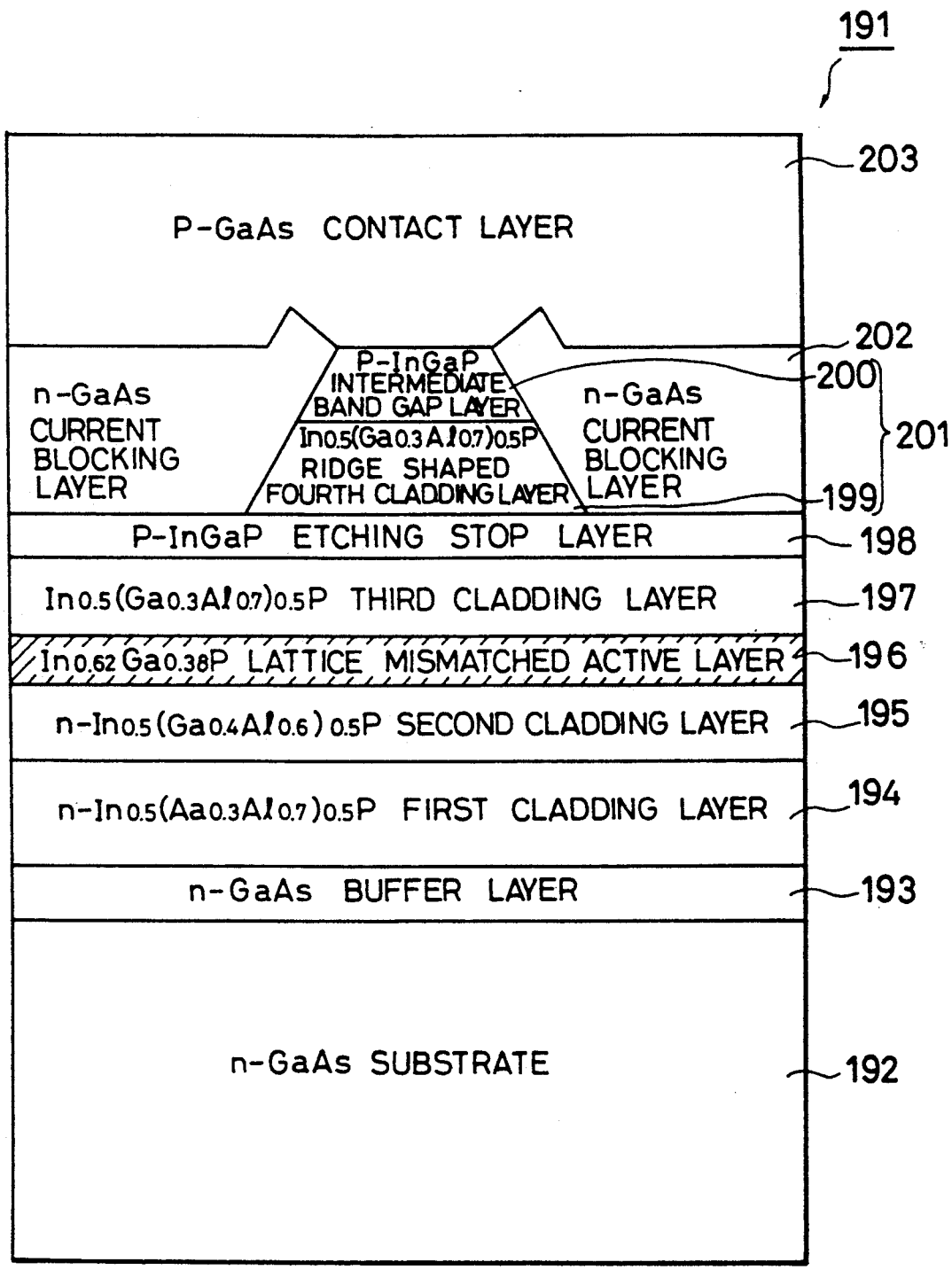
FIG. 24 is a schematic cross sectional view of a semiconductor device according to a third embodiment of the third modification, showing a ridge waveguide type of $In_{1-y}(Ga_{1-x}Al_x)_yP$ semiconductor laser device in which the lateral mode of the laser beam is controlled.

FIG. 24 is a schematic cross sectional view of a semiconductor device according to a third embodiment of the third modification, showing a ridge waveguide type of $In_{1-y}(Ga_{1-x}Al_x)_yP$ semiconductor laser device in which the lateral mode of the laser beam is controlled.

As shown in FIG. 24, a ridge waveguide type of $In_{1-y}(Ga_{1-x}Al_x)_yP$ semiconductor laser device 191 comprises:

a substrate 192 formed by an n type GaAs crystal of which the crystal is cut to orient along a specific plane direction leaning from a (100) plan direction by an angle of 10° toward a direction equivalent to a <011> direction;

a buffer layer 193 formed by an n type GaAs or InGaP crystal and mounted on the substrate 192;

an n type first cladding layer 194 formed by an n type $In_{0.5}(Ga_{0.3}Al_{0.7})_{0.5}P$ crystal and mounted on the buffer layer 193;

an n type second cladding layer 195 formed by an n type $In_{0.5}(Ga_{0.4}Al_{0.6})_{0.5}P$ crystal and mounted on the first cladding layer 194;

a lattice mismatched active layer 196 formed by a $In_{0.62}Ga_{0.38}P$ crystal and mounted on the second cladding layer 195;

a p type third cladding layer 197 formed by a p type $In_{0.5}(Ga_{0.3}Al_{0.7})_{0.5}P$ crystal and mounted on the active layer 196;

a p type etching stop layer 198 formed by a p type InGaP or GaAlAs crystal and mounted on the third cladding layer 197;

a p type ridge shaped fourth cladding layer 199 formed by a p type $In_{0.5}(Ga_{0.3}Al_{0.7})_{0.5}P$ crystal and mounted on the etching stop layer 198;

a p type intermediate band gap layer 200 formed by a p type InGaP or GaAlAs crystal and mounted on the fourth cladding layer 199, a ridge section 201 being shaped by the fourth cladding layer 199 and the intermediate band gap layer 200;

a pair of n type current blocking layers 202 formed by an n type GaAs or GaAlAs crystal and mounted on the etching stop layer 198 to surround the ridge section 201; and a contact layer 203 formed by a p type GaAs crystal and mounted on the intermediate band gap layer 200 and the current blocking layers 202.

The lattice constant of the lattice mismatched active layer 196 is 1.0% larger than that of the substrate 192 as shown in FIG. 4. In addition, the thickness D of the lattice mismatched active layer 196 is 0.015 μm.

Impurity Zn is doped in the semiconductor device 191 to make the p type layers 197 to 200, and 203 by the concentration of $1 \times 10^{18}$ atoms/cm$^{-3}$. Moreover, impurity Si is doped in the semiconductor device 191 to make the n type layer 193 to 195, and 202 and the substrate 192 by the concentration of $1 \times 10^{17}$ atoms/cm$^{-3}$.

The substrate 192, and the layers 193 to 199 are successively grown by an epitaxy growth technique such as a reduced-pressure MOCVD method.

The composition $In_{0.62}Ga_{0.38}P$ of the active layer 196 is obtained by setting Al ration at X=0 and setting Ga ratio at Y=0.38 in the $In_{1-y}(Ga_{1-x}Al_x)_yP$ expression.

In the above structure of the semiconductor laser device 191, the energy band-gaps in the cladding layers 195, 197 are increased because the layers are grown on the substrate 192 cut to orient along the specific plane direction. In addition, the energy band-gap decreased by the lattice mismatch in the active layer 196 is compensated because the layer is grown on the substrate 192 cut to orient along the specific plane direction.

Accordingly, the device characteristics is the same as those in the first embodiment of the third modification.

That is, the high intensity of the laser beam can be radiated at a high temperature.

In addition, the laser beam with the shortened wavelength can be radiated from the semiconductor laser device 191 while the improvement of the temperature characteristics is maintained.

The Al composition ratios in the cladding layer 194, 195, 197, and 199 are not limited to the third embodiment. That is, it is preferable that the Al composition ratios in the cladding layer 194, 195, 197, and 199 be suitably determined on condition that the energy band-gap in the second cladding layer 195 is smaller than those in the cladding layers 194, 197, and 199 and is larger than that in the active layer 196.

The third modification of the present invention is not limited to the above mentioned first to third embodiments. That is, the superior temperature characteristics can be obtained in a semiconductor laser device with the double heterostructure formed by an InGaAlP or InGaAsP crystal. In addition, the superior temperature characteristics can be obtained in a semiconductor laser device with the double heterostructure formed by a binary mixed crystal, for example, (InP)(GaP).

Moreover, the superior temperature characteristics can be obtained in a gain-guided type of semiconductor laser device, in a wide stripe type of semiconductor laser device, in a semiconductor laser device in which carriers are not injected to a laser-beam-emitting surface, and in a semiconductor laser device with a window positioned on a laser-beam-emitting surface in which concentrated lights are not absorbed.

Further, the superior temperature characteristics can be obtained in a light-emitting diode.

The material of the substrate 162, 182, or 192 is not limited to the GaAs type of material. That is, any material of which the lattice constant is almost the same as that of the GaAs crystal is available. For example, an AlAs type of material is available.

The third modification is not limited to the reduced-pressure MOCVD method. That is, a molecular beam epitaxy (MBE) method or a gas source MBE method is available.

The present invention is described by disclosing the first to third modifications. However, the present invention is not limited to each modification. That is, the combination of the modifications is available.

For example, it is preferable that the cladding layer 16 shown in FIG. 3 be formed by changing the growing conditions to make no natural superlattice structure in the cladding layer 16. That is, the first and second modifications are combined. In this case, the energy barrier between the active layer 14 and the cladding layer 16 can be enlarged. Or, the energy barrier can be maintained even though the absolute value of the lattice mismatch $\Delta a/a$ is lessened in the active layer 14 and/or the cladding layer 16.

In addition, it is preferable that the substrate 12 shown in FIG. 3 be cut so as to orient along a specific plane direction leaning from a (100) plane direction by a prescribed angle to the negative or positive direction equivalent to a <011> direction. That is, the first and third modifications are combined. In this case, the wavelength of the laser beam radiated from the device 11 can be shortened while the energy barrier between the active layer 14 and the cladding layer 16 is maintained. Moreover, the generation of the misfit dislocations and the growth of the undesirable lattice defects can be efficiently prevented.

Moreover, it is preferable that the substrate 42 shown in FIG. 8 be cut so as to orient along the specific plane direction. That is, the second and third modifications are combined. In this case, the wavelength of the laser beam radiated from the device 41 can be shortened while the increased energy barrier between the active layer 44 and the cladding layer 46 is maintained.

Further, it is preferable that the cladding layer 16 shown in FIG. 3 be formed by changing the growing conditions to make no natural superlattice structure and the substrate 12 shown in FIG. 3 be cut so as to orient along the specific plane direction. That is, the first to third modifications are combined.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A semiconductor laser device for radiating a laser beam from a double heterostructure section in which injected carriers having an energy source of the laser beam are confirmed, comprising:

a compound semiconductor substrate with a prescribed lattice constant for loading the double heterostructure section;

a lattice mismatched active layer with a first lattice constant which is 0.5% to 2.0% larger than the prescribed lattice constant of the substrate in the double heterostructure section for radiating the laser beam, an energy band-gap of the lattice mismatched active layer being smaller than that of a crystal with the prescribed lattice constant from which the laser beam is radiated;

a lattice mismatched cladding layer with a second lattice constant which is 0.2% to 2.0% smaller than the lattice prescribed constant of the substrate for confining the injected carriers in the active layer,
   (1) the lattice mismatched cladding layer being arranged on one side of the active layer in the double heterostructure section, and
   (2) an energy band-gap of the lattice mismatched cladding layer being larger than that of a crystal with the prescribed lattice constant which confines the injected carriers in the active layer; and a cladding layer arranged on another side of the active layer in the double heterostructure section for confining the injected carriers in the active layer by co-operating with the lattice mismatched cladding layer.

2. A device according to the claim 1 in which the substrate is formed by a GaAs crystal, the lattice mismatched active layer is formed by an $In_{1-x}Ga_xP$ crystal where $0.26 \leq X \leq 0.44$, and the lattice mismatched cladding layer is formed by an $In_{1-y}(Ga_{0.3}Al_{0.7})_yP$ crystal where $0.52 \leq Y \leq 0.70$.

3. A device according to the claim 1 in which the substrate is formed by a GaAs crystal, the lattice mismatched active layer is formed by an $In_{1-x}Ga_xP$ crystal where $0.26 \leq X \leq 0.44$, the lattice mismatched cladding layer is formed by an $In_{1-y}(Ga_{0.3}Al_{0.7})_yP$ crystal where $0.52 \leq Y \leq 0.70$, and the cladding layer is formed by an $In_{0.5}(Ga_{0.3}Al_{0.7})_{0.5}P$ crystal of which a lattice constant agrees with that of the substrate.

4. A device according to the claim 1 in which the conductive type of the lattice mismatched cladding layer is p type and the conductive type of the cladding layer is n type.

5. A device according to the claim 1 in which the substrate is formed by an n type GaAs crystal, the cladding layer is formed on the substrate by an n type $In_{0.5}(Ga_{0.3}Al_{0.7})_{0.5}P$ crystal of which a lattice constant agrees with that of the substrate, the lattice mismatched active layer is formed on the cladding layer by an $In_{1-x}Ga_xP$ crystal where $0.26 \leq X \leq 0.44$, and the lattice mismatched cladding layer is formed on the active layer by an p type $In_{1-y}(Ga_{0.3}Al_{0.7})_yP$ crystal where $0.52 \leq Y \leq 0.70$.

6. A device according to the claim 1 further including:

a ridge shaped cladding layer mounted on the double heterostructure section for transmitting the injected carriers to the double heterostructure section; and a current blocking layer mounted on the double heterostructure section and surrounding the ridge shaped cladding layer for blocking the injected currents.

7. A device according to the claim 1 in which the thickness D (Å) of the lattice mismatched active layer is within a range from 100 Å to 400 Å and the lattice mismatch Δa/a (%) of the active layer satisfies $$0 < \Delta a/a \leq 200/D \text{ and } 0.5 \leq \Delta a/a \leq 2.0,$$

and the thickness T (Å) of the lattice mismatched cladding layer is within a range from 100 Å to 1000 Å and the lattice mismatch Δb/b (%) of the lattice mismatched cladding layer satisfies $$-200T \leq \Delta b/b < 0 \text{ and } -0.2 \leq \Delta b/b \leq -2.0.$$

8. A device according to the claim 7 in which the thickness D (Å) of the lattice mismatched active layer, the thickness T (Å) of the lattice mismatched cladding layer, the lattice mismatch Δa/a (%) of the lattice mismatched active layer, and the lattice mismatch Δb/B (%) of the lattice mismatched cladding layer satisfy a following equation $$D \times \Delta a/a + T \times \Delta b/b = 0.$$

9. A device according to the claim 1 in which the lattice mismatched active layer is fabricated by a quantum well structure formed by a quantum well and a barrier layer.

10. A device according to the claim 1 in which no natural superlattice structure is formed in the lattice mismatched cladding layer.

11. A device according to the claim 1 in which the compound semiconductor substrate is formed by a crystal with a prescribed lattice constant and has a specific plane direction which leans by a prescribed angle toward a predetermined direction equivalent to a <011> direction from a (100) plane.

12. In a semiconductor laser device for radiating a laser beam from a double heterostructure section in which injected carriers having an energy source of the laser beam are confined, comprising:
 a compound semiconductor substrate with a prescribed lattice constant for loading the double heterostructure section;
 a latticed mismatched active layer with a first lattice constant which is 0.3% to 2.5% larger than the prescribed lattice constant of the substrate in the double heterostructure section for radiating the laser beam, an energy band-gap of the lattice mismatched active layer being smaller than that of a crystal with the prescribed lattice constant from which the laser beam is radiated;
 a first cladding layer with no natural superlattice structure for confining the injected carriers in the active layer,
  (1) the first cladding layer being grown on one side of the lattice mismatched active layer in the double heterostructure section,
  (2) the first cladding layer making an epitaxial junction with the active layer, and
  (3) an energy band-gap of the first cladding layer being larger than that of a crystal with a natural superlattice regularly directed in a <111> direction which confines the injected carriers in the active layer; and
 a second cladding layer grown on another side of the active layer in the double heterostructure section for confining the injected carriers in the active layer by cooperating with the first cladding layer.

13. A device according to the claim 12 in which the lattice mismatched active layer is formed by an In$_{1-x}$Ga$_x$P crystal where $0.20 \leq X \leq 0.47$.

14. A device according to the claim 12 in which the conductive type of the first cladding layer is p type and the conductive type of the second cladding layer is n type.

15. A device according to the claim 12 in which a ratio occupied by no natural superlattice structure portion in the first cladding layer is adjusted by shifting a growing temperature of the first cladding layer, a molecular ratio of a V-family material to a III-family material, the concentration of the injected carriers in the first cladding layer, and a growing rate of the first cladding layer.

16. A device according to the claim 12 in which the compound semiconductor substrate has a specific plane direction which leans by a prescribed angel toward a predetermined direction equivalent to a <011> direction from a (100) plane.

17. In a semiconductor laser device for radiating a laser beam by confining injected carriers having an energy source of the laser beam, comprising:
 a compound semiconductor substrate which is formed by a crystal with a prescribed lattice constant and has a specific plane direction which leans by a prescribed angel toward a predetermined direction equivalent to a <011> direction from a (100) plane;
 a first cladding layer grown on the substrate at an epitaxial junction;
 a lattice mismatched active layer with a first lattice constant which is 0.5% to 2.0% larger than the prescribed lattice constant of the substrate for radiating the laser beam,
  (1) the active layer being grown on the first cladding layer at an epitaxial junction, and
  (2) an energy band-gap of the lattice mismatched active layer being smaller than that of a crystal with the prescribed lattice constant from which the laser beam is radiated; and
 a second cladding layer grown on the active layer at an epitaxial junction for confining the injected carriers in the active layer by co-operating with the first cladding layer.

18. A device according to the claim 17 in which the lattice mismatched active layer is formed by an In$_{1-x}$Ga$_x$P crystal where $0.26 \leq X \leq 0.44$.

19. A device according to the claim 17 in which the specific plane direction of the compound semiconductor substrate leans in the range up to 15° toward the predetermined direction equivalent to the <011> direction from the (100) plane.

20. A device according to the claim 17 in which the thickness D (Å) of the lattice mismatched active layer is within a range from 100 Å to 400 Å and the lattice mismatch Δa/a (%) of the active layer satisfies $$0 < \Delta a/a \leq 200/D \text{ and } 0.5 \leq \Delta a/a \leq 2.0.$$

* * * * *